(12) United States Patent
Utomo et al.

(10) Patent No.: US 9,029,913 B2
(45) Date of Patent: May 12, 2015

(54) SILICON-GERMANIUM FINS AND SILICON FINS ON A BULK SUBSTRATE

(71) Applicant: International Business Machines Corporation, Armonk, NY (US)

(72) Inventors: Henry K. Utomo, Newburgh, NY (US); Kangguo Cheng, Schenectady, NY (US); Ramachandra Divakaruni, Ossining, NY (US); Myung-Hee Na, Lagrangeville, NY (US); Ravikumar Ramachandran, Pleasantville, NY (US); Huiling Shang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/792,291

(22) Filed: Mar. 11, 2013

(65) Prior Publication Data
US 2014/0252413 A1  Sep. 11, 2014

(51) Int. Cl.
*H01L 29/66* (2006.01)
*H01L 29/78* (2006.01)

(52) U.S. Cl.
CPC ........ *H01L 29/785* (2013.01); *H01L 29/66795* (2013.01)

(58) Field of Classification Search
CPC ................. H01L 29/7831; H01L 2924/13067; H01L 27/0879; H01L 27/10826
USPC ......................................................... 257/192
See application file for complete search history.

(56) References Cited

U.S. PATENT DOCUMENTS

| | | | | |
|---|---|---|---|---|
| 8,048,723 B2 * | 11/2011 | Chang et al. | .................. | 438/135 |
| 2005/0156171 A1 * | 7/2005 | Brask et al. | ..................... | 257/72 |
| 2008/0048233 A1 * | 2/2008 | Zhu et al. | ....................... | 257/302 |
| 2008/0090348 A1 * | 4/2008 | Chang et al. | .................. | 438/199 |
| 2010/0144121 A1 | 6/2010 | Chang et al. | | |
| 2010/0258870 A1 | 10/2010 | Hsu et al. | | |
| 2011/0117679 A1 | 5/2011 | Lee et al. | | |
| 2011/0147811 A1 * | 6/2011 | Kavalieros et al. | ........... | 257/288 |
| 2011/0227165 A1 * | 9/2011 | Basker et al. | ................. | 257/369 |

FOREIGN PATENT DOCUMENTS

KR    10-2007-0117143    12/2007

OTHER PUBLICATIONS

International Search Report/Written Opinion; PCT/US2014/014999; dated May 28, 2014.

* cited by examiner

*Primary Examiner* — Matthew Landau
*Assistant Examiner* — Eric Ashbahian
(74) *Attorney, Agent, or Firm* — Scully, Scott, Murphy & Presser, P.C.; H. Daniel Schnurmann

(57) ABSTRACT

A first silicon-germanium alloy layer is formed on a semiconductor substrate including silicon. A stack of a first silicon layer and a second silicon-germanium alloy layer is formed over a first region of the first silicon-germanium alloy layer, and a second silicon layer thicker than the first silicon layer is formed over a second region of the first silicon-germanium alloy layer. At least one first semiconductor fin is formed in the first region, and at least one second semiconductor fin is formed in the second region. Remaining portions of the first silicon layer are removed to provide at least one silicon-germanium alloy fin in the first region, while at least one silicon fin is provided in the second region. Fin field effect transistors can be formed on the at least one silicon-germanium alloy fin and the at least one silicon fin.

22 Claims, 22 Drawing Sheets

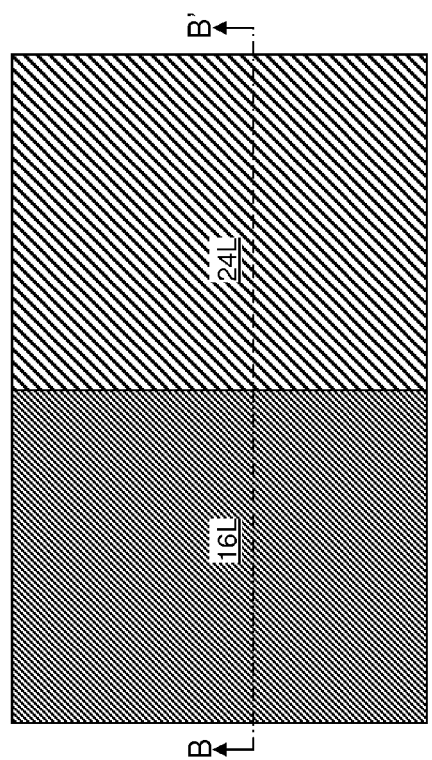
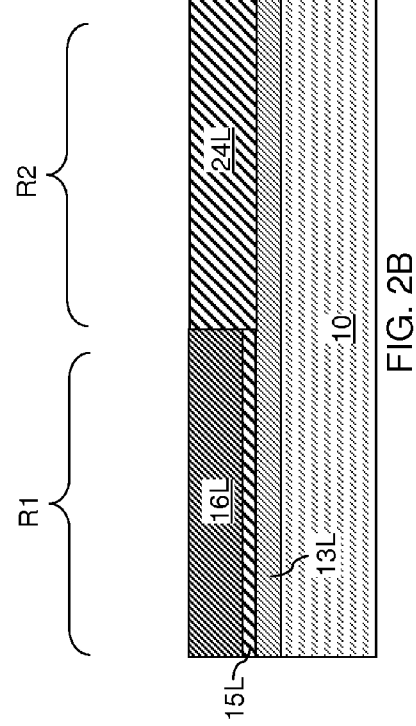
FIG. 2A
FIG. 2B

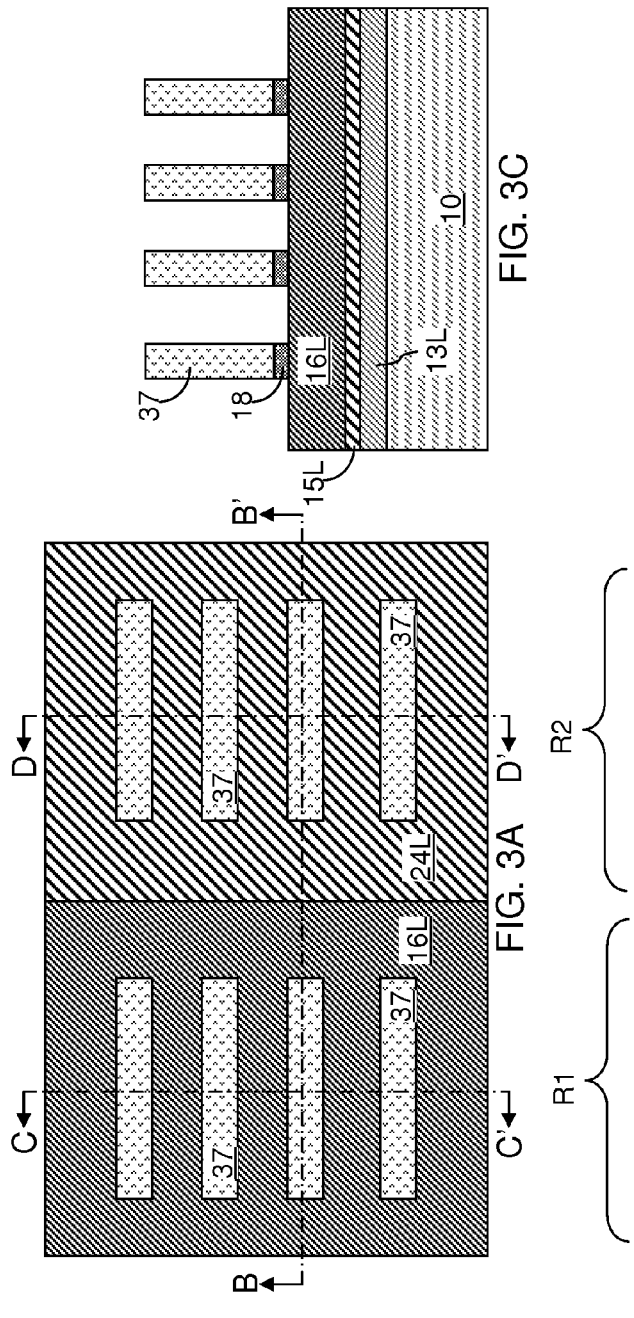
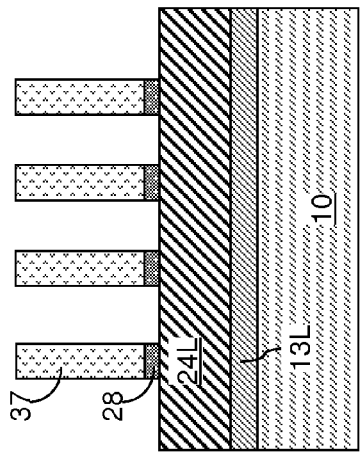
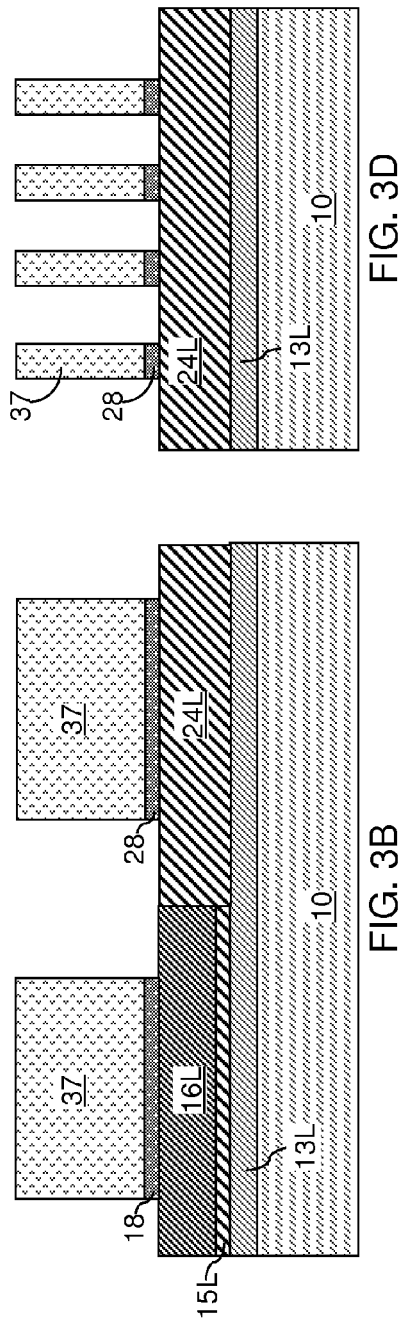

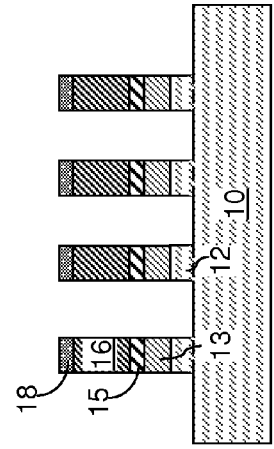
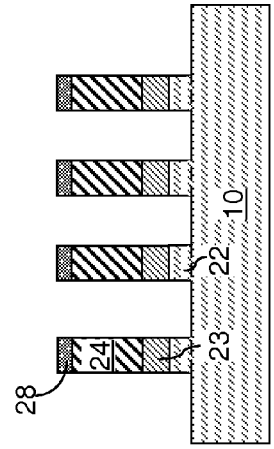
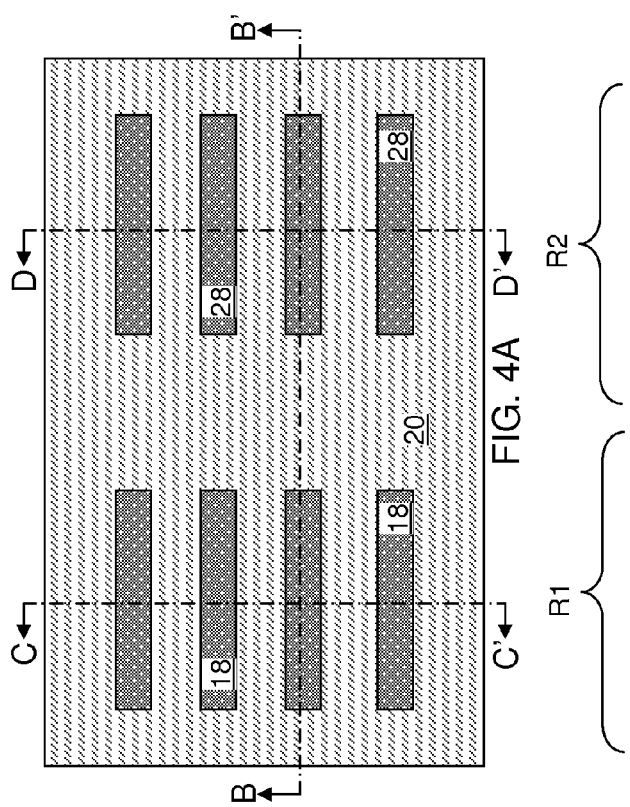
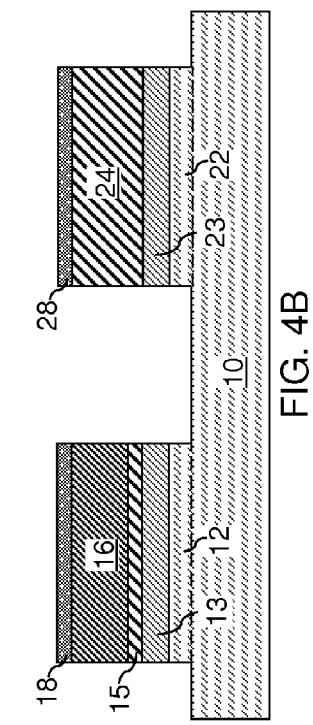

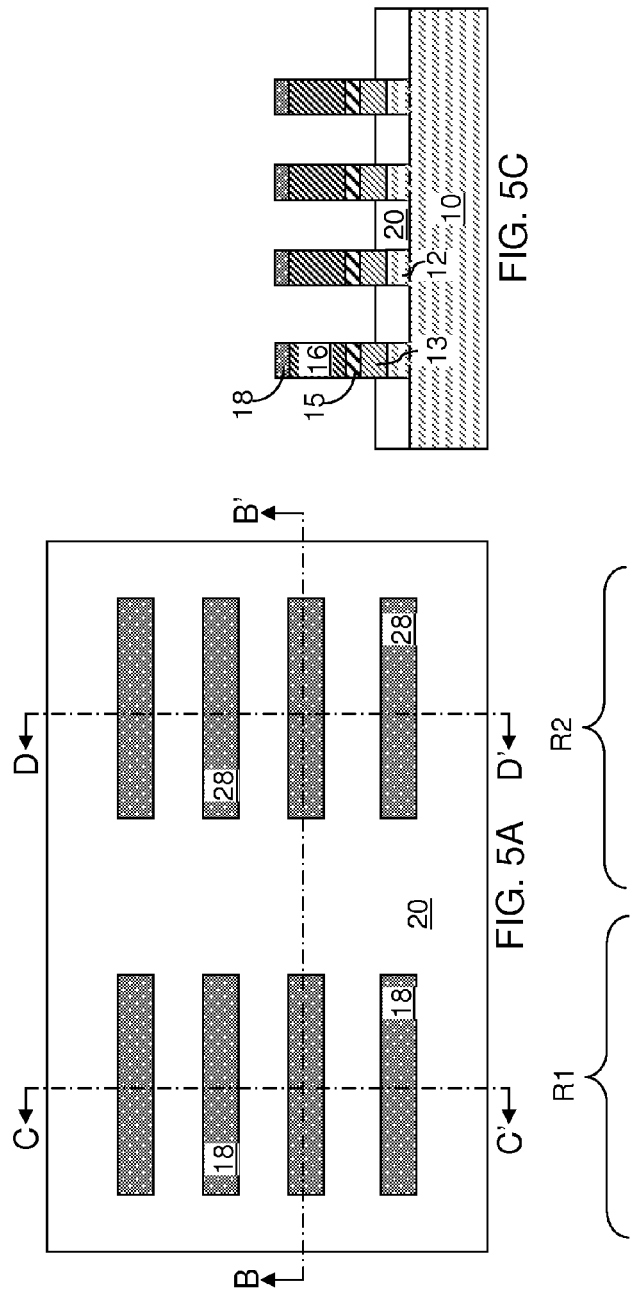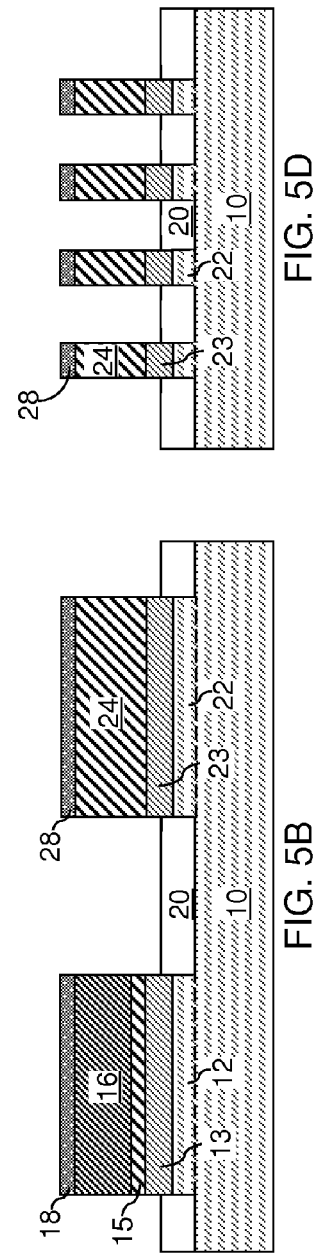
FIG. 5A  FIG. 5B  FIG. 5C  FIG. 5D

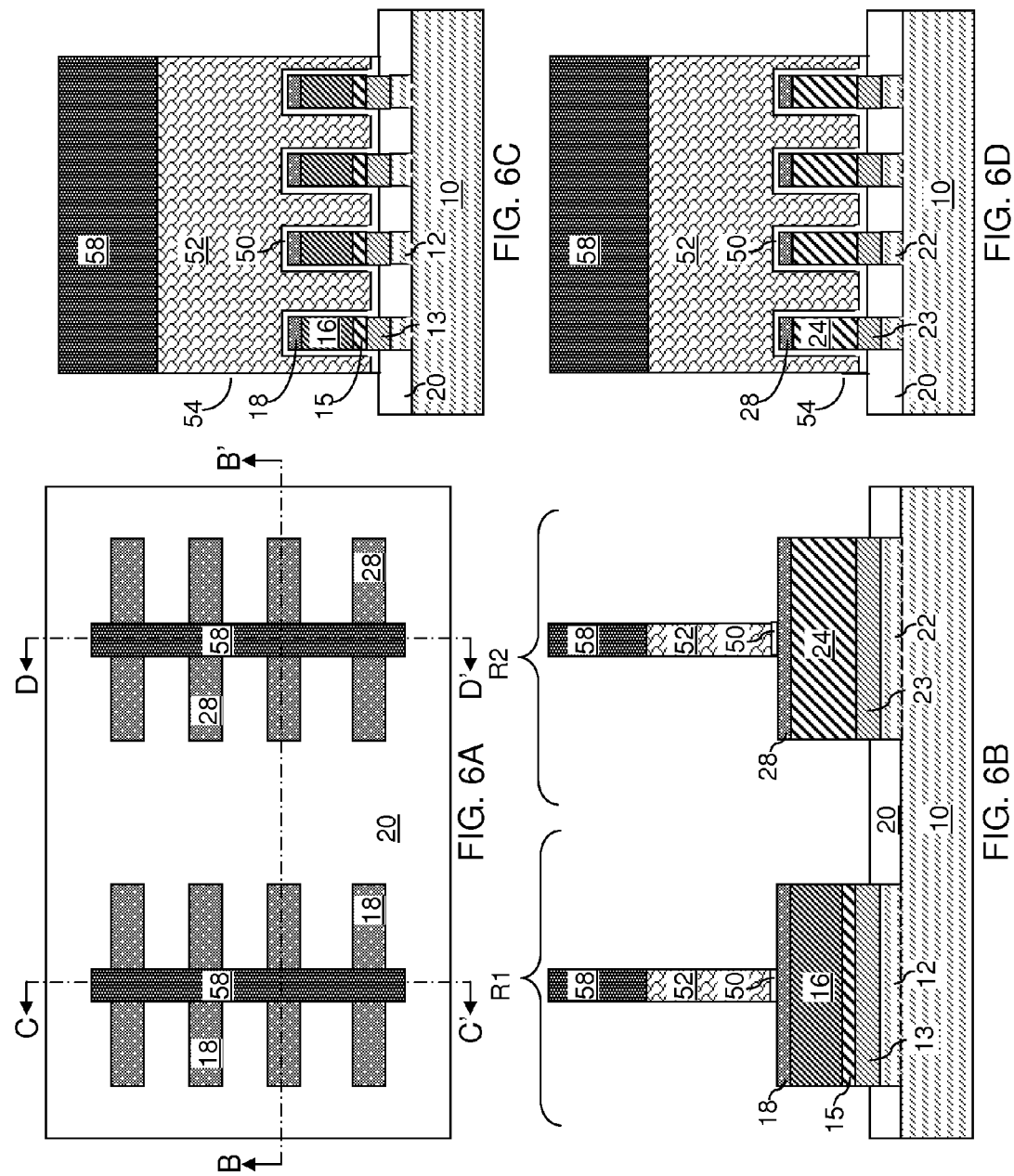

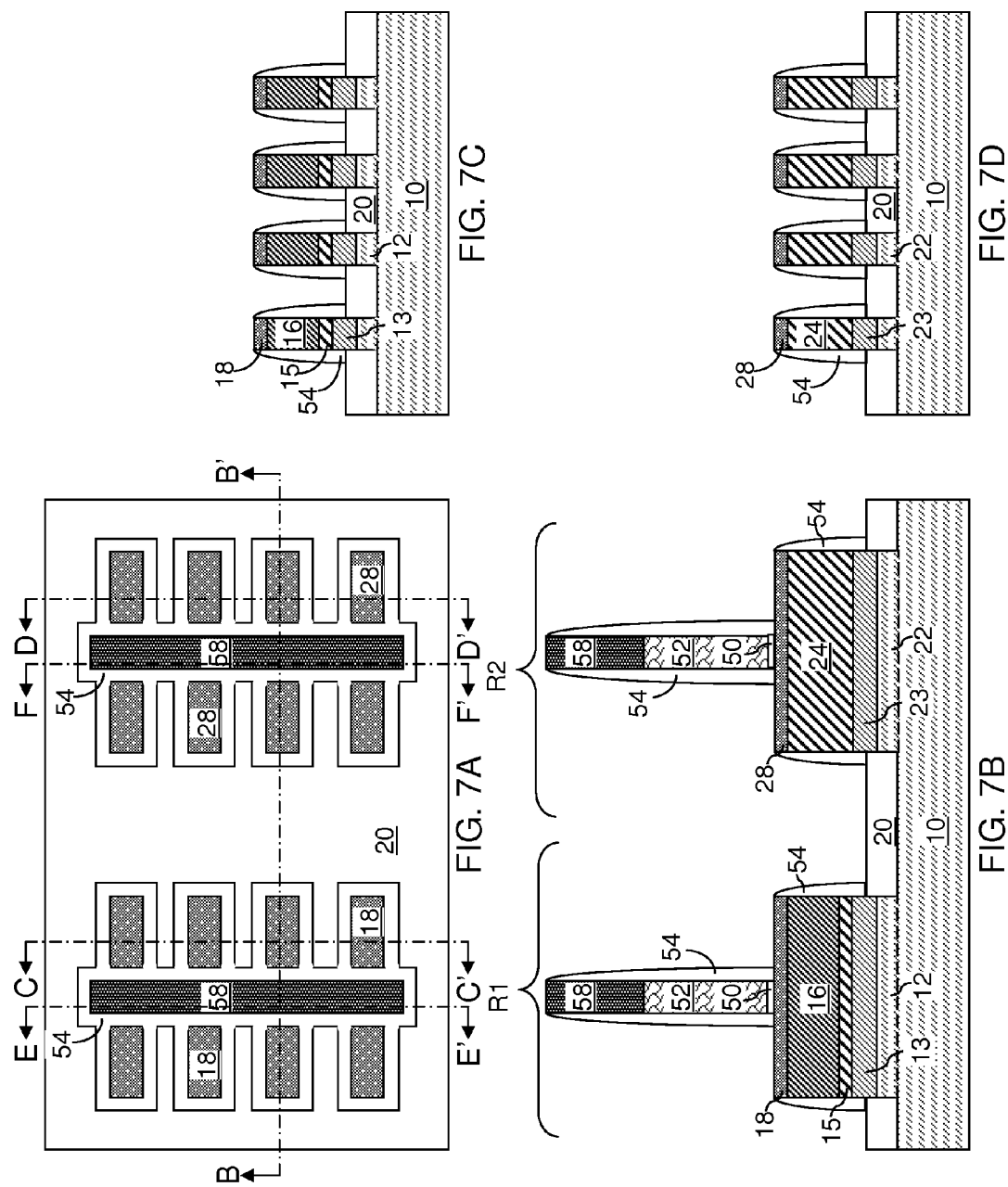

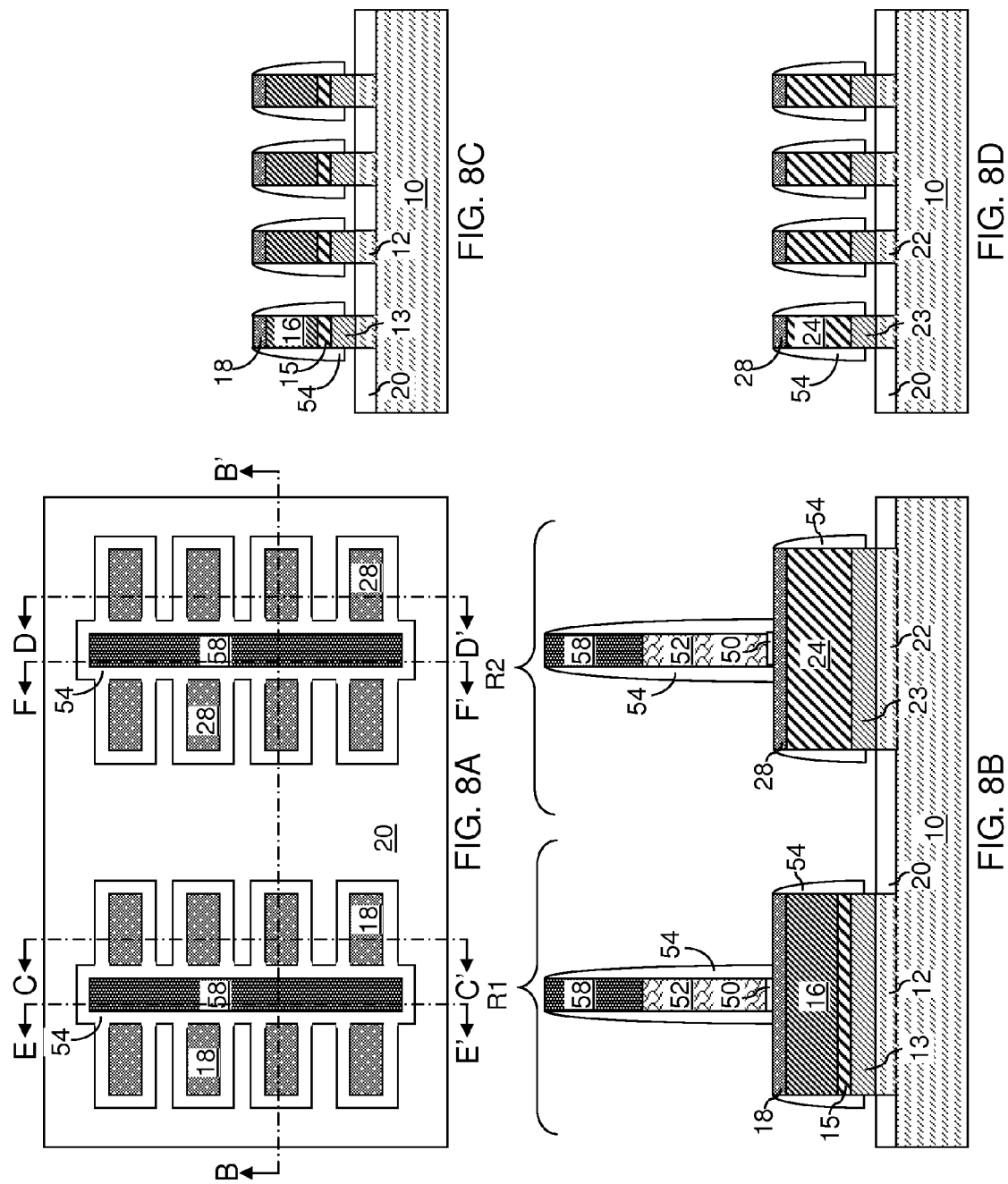

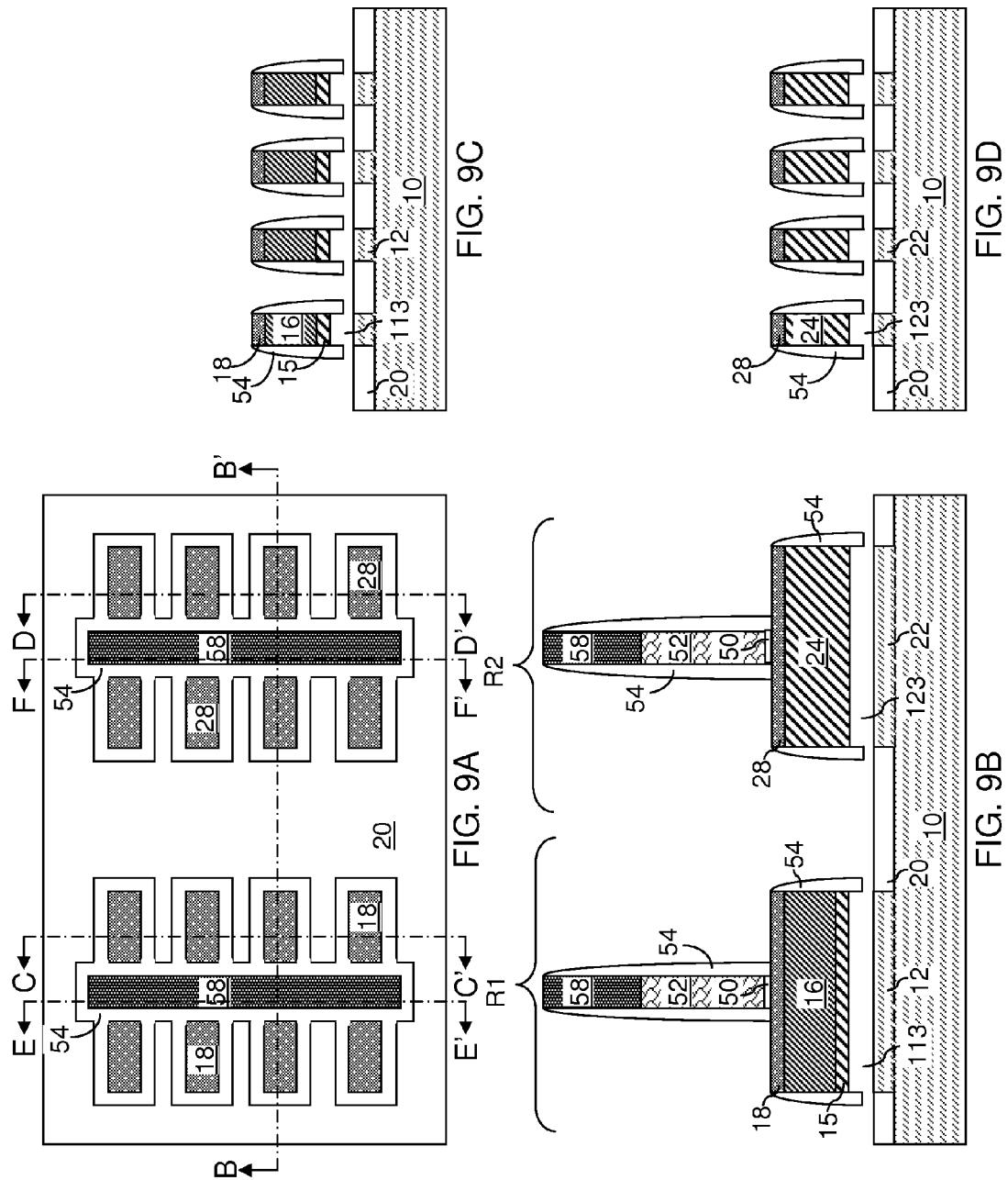

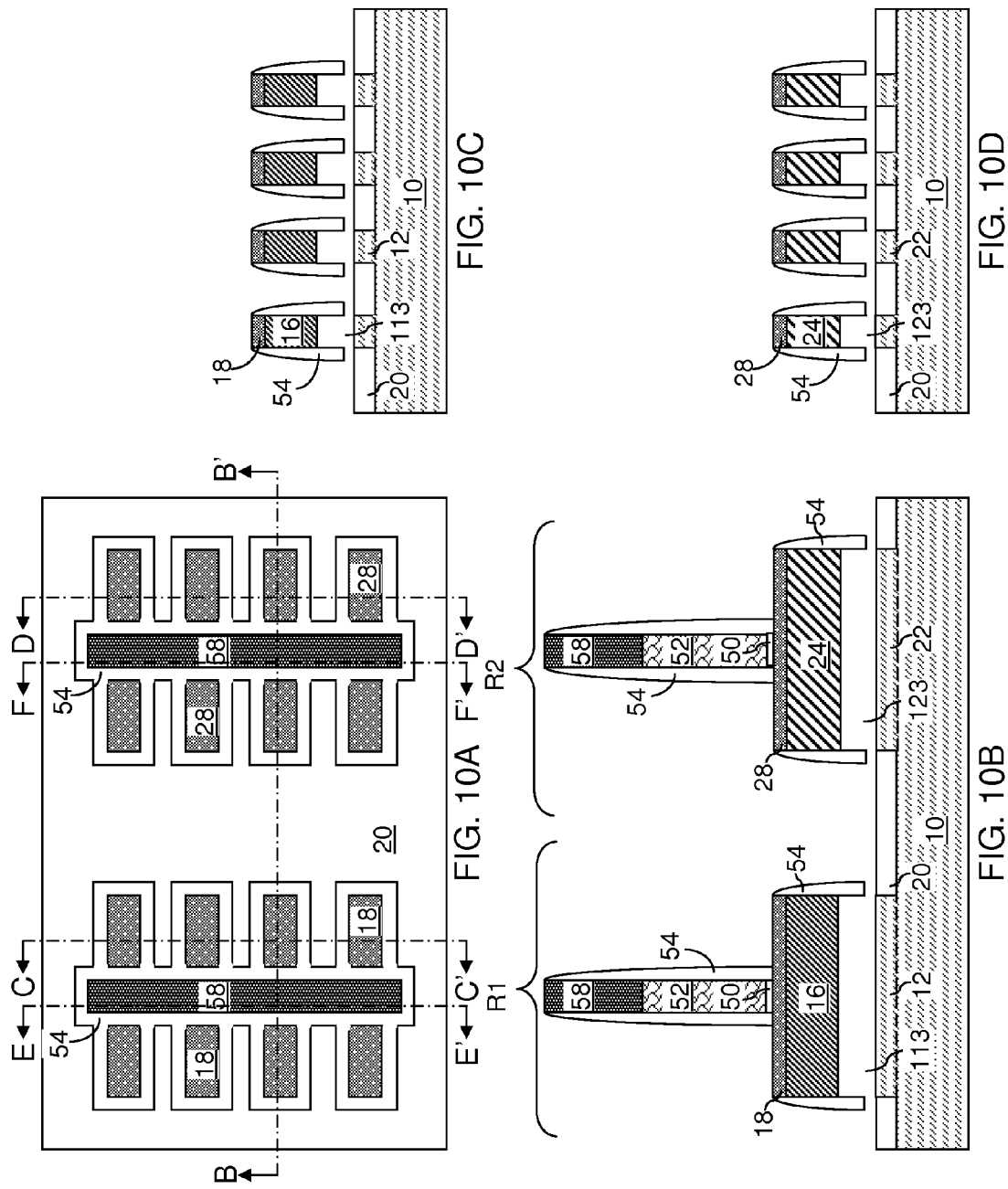

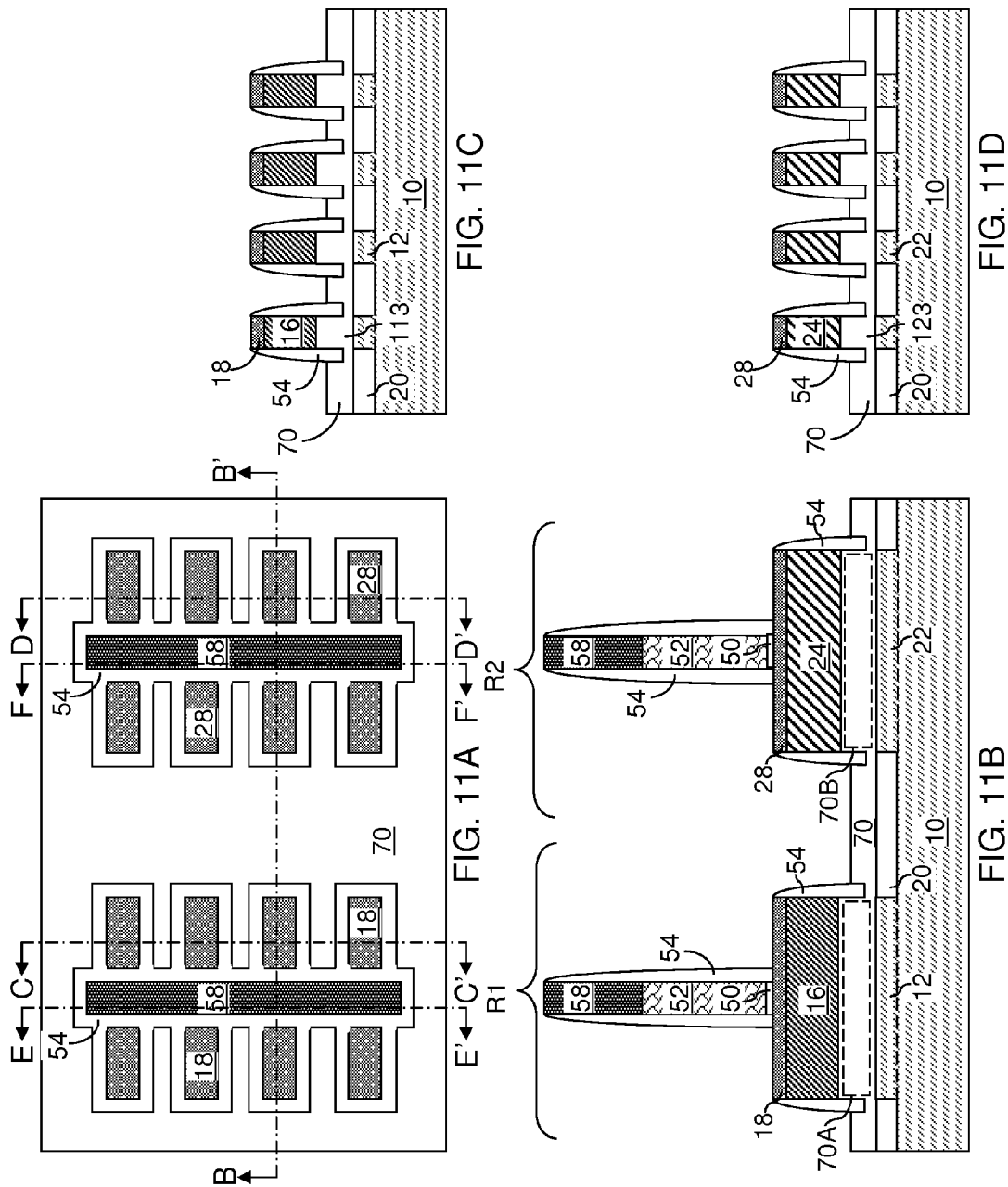

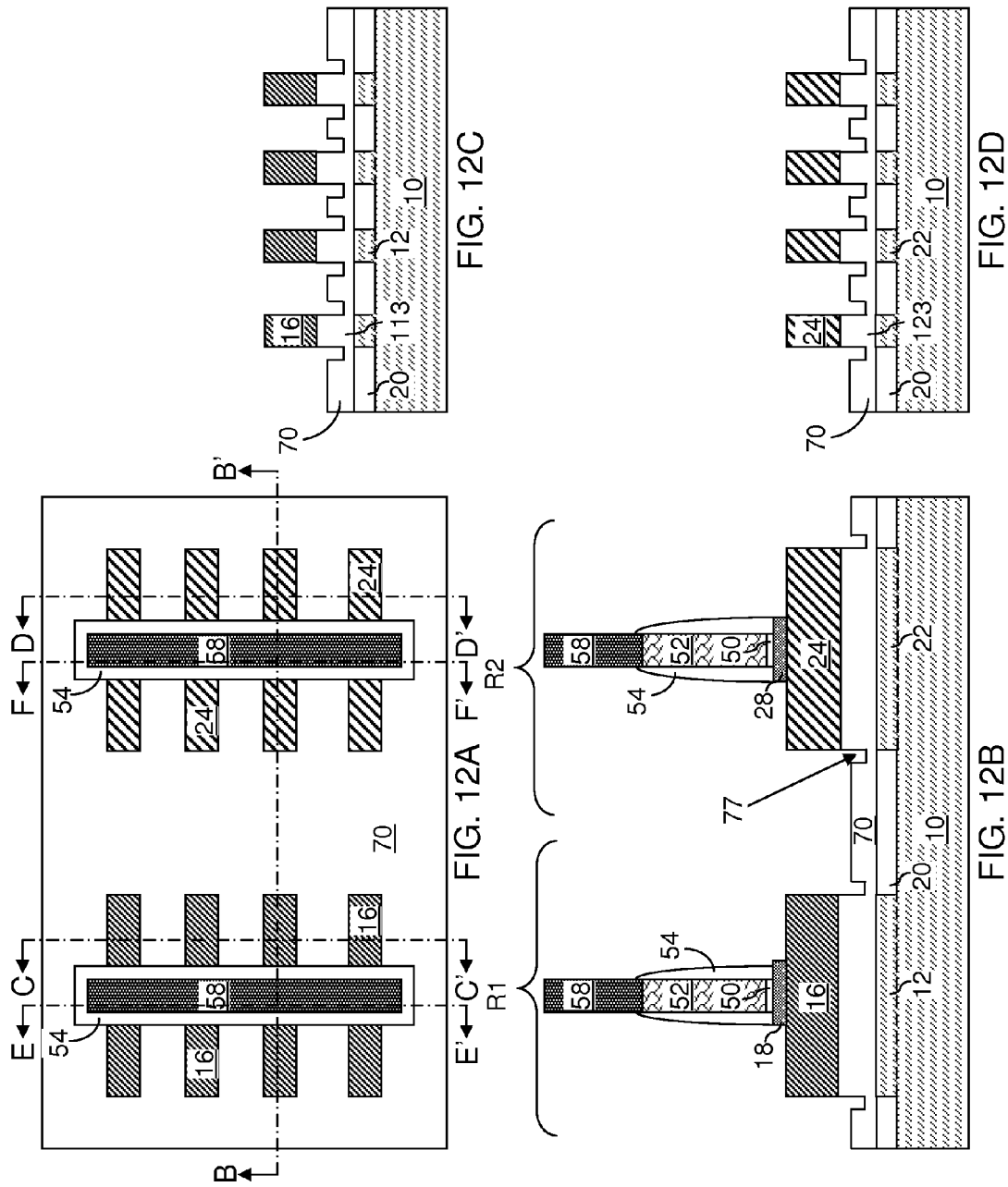

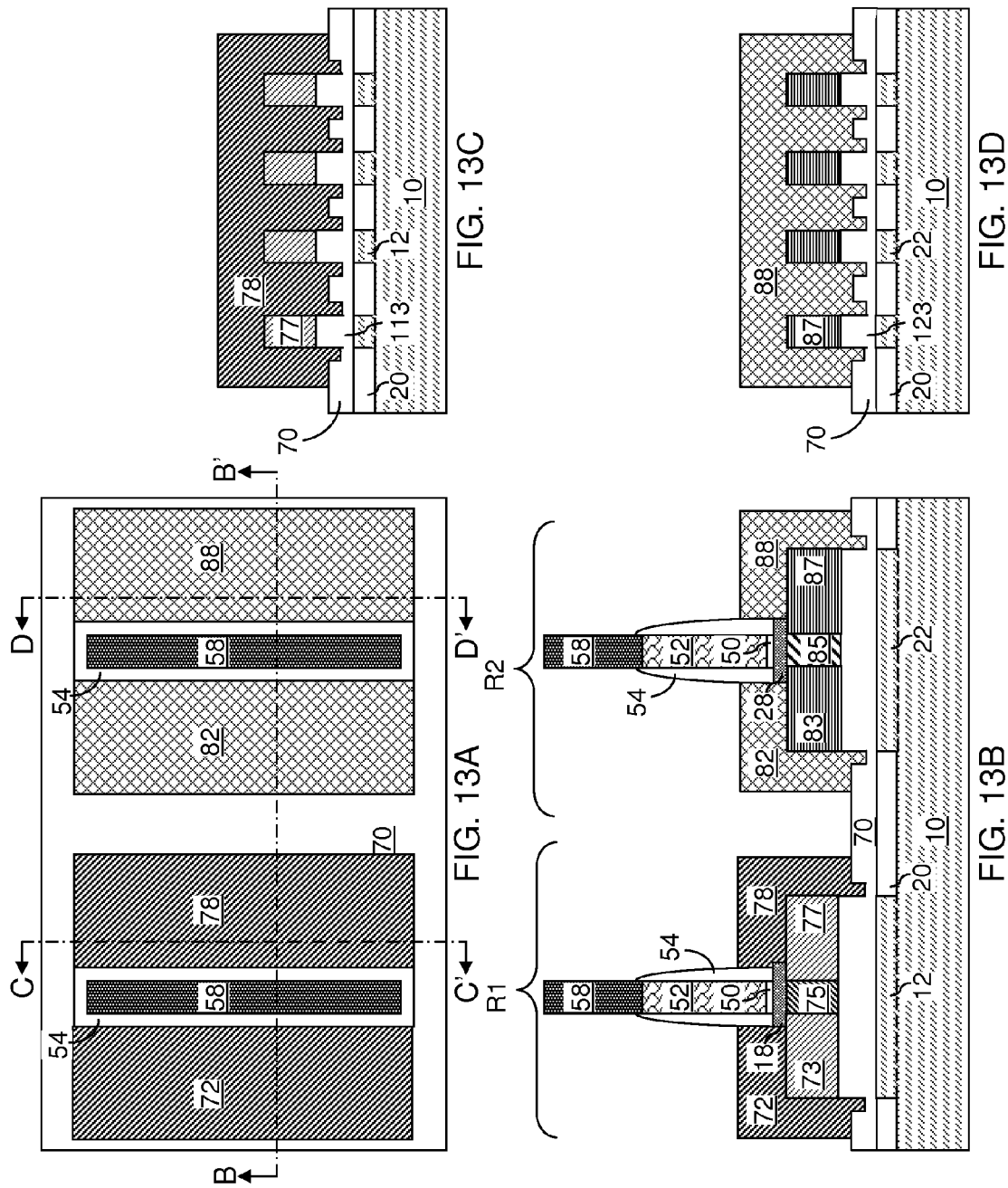

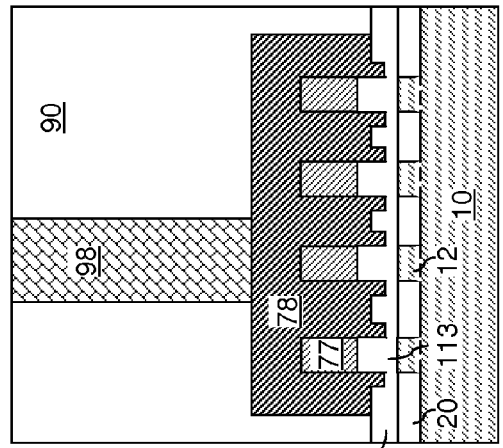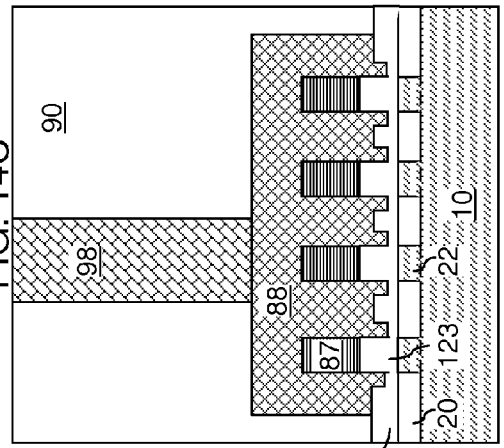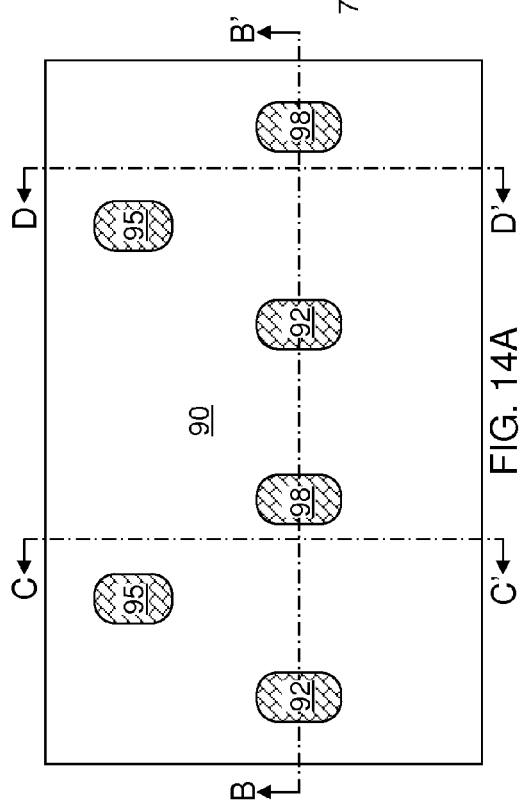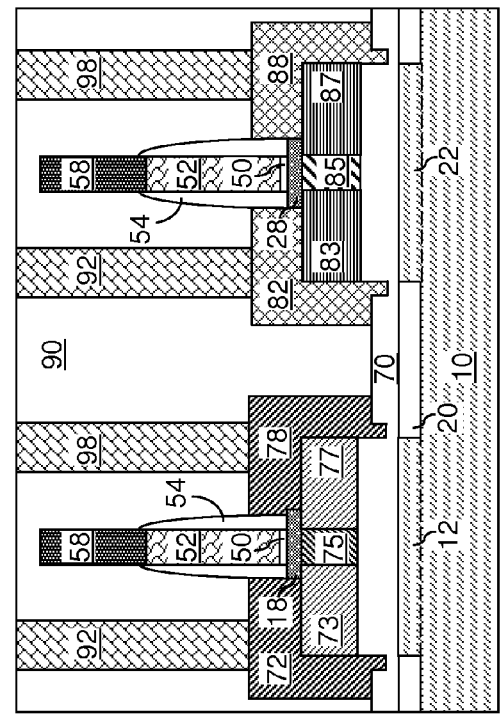

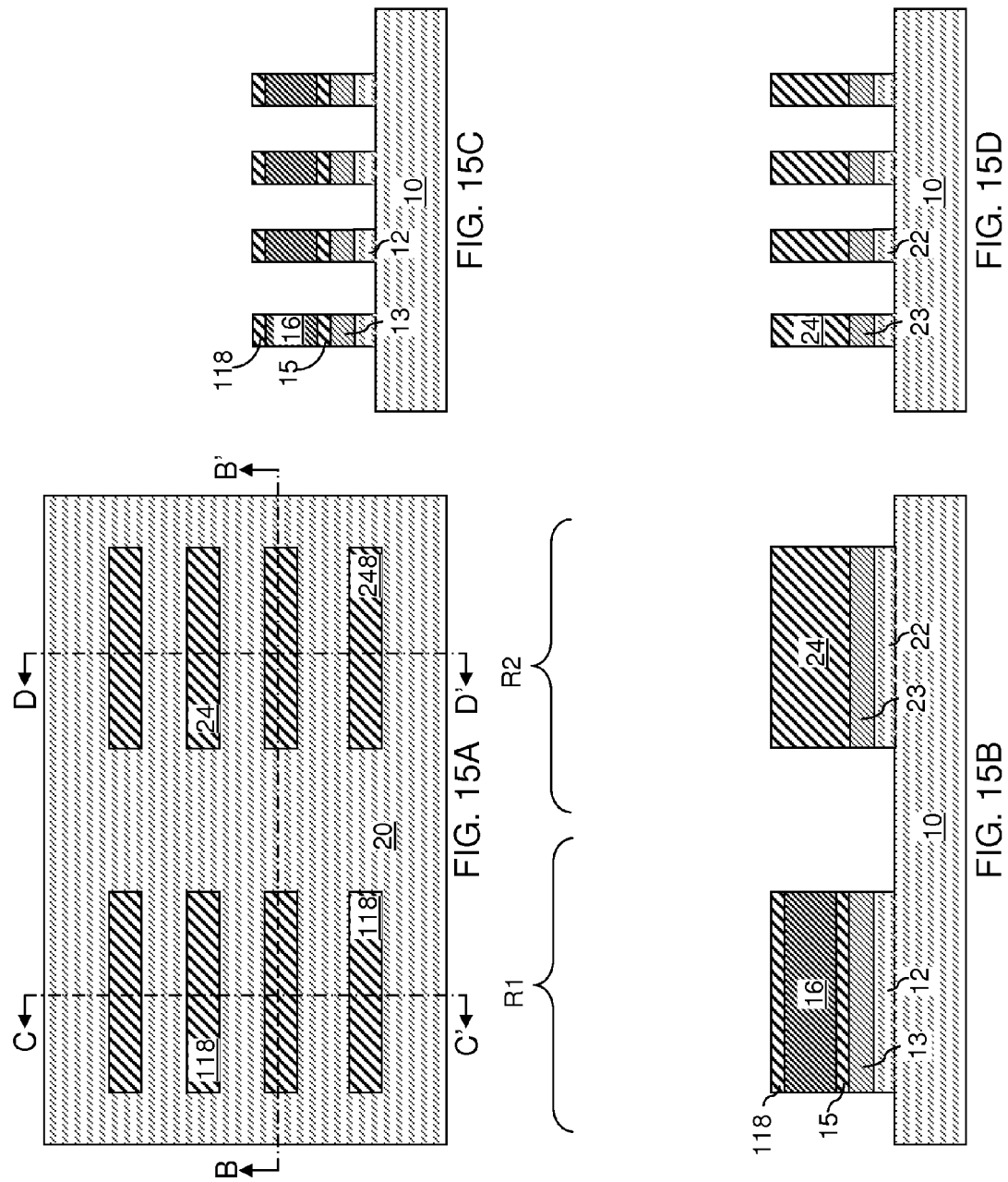

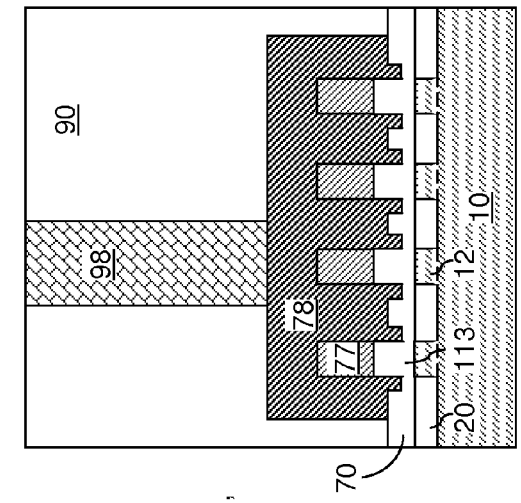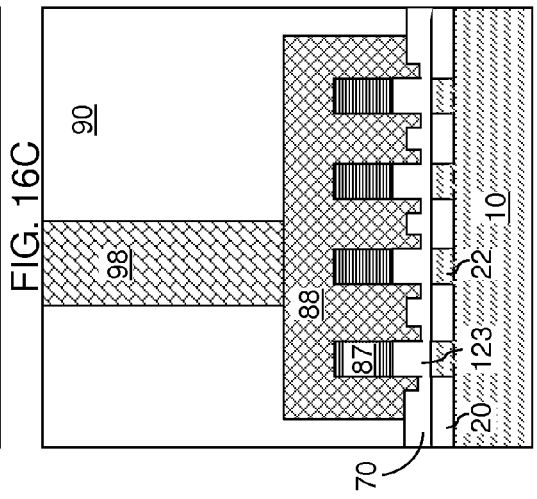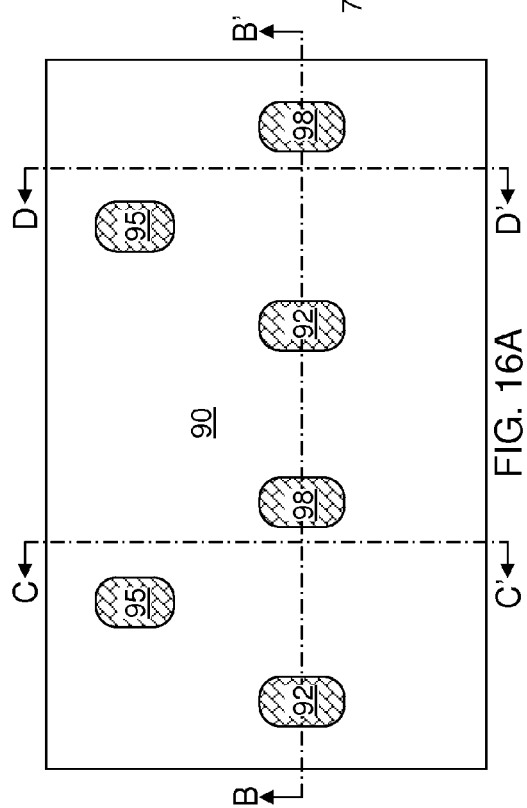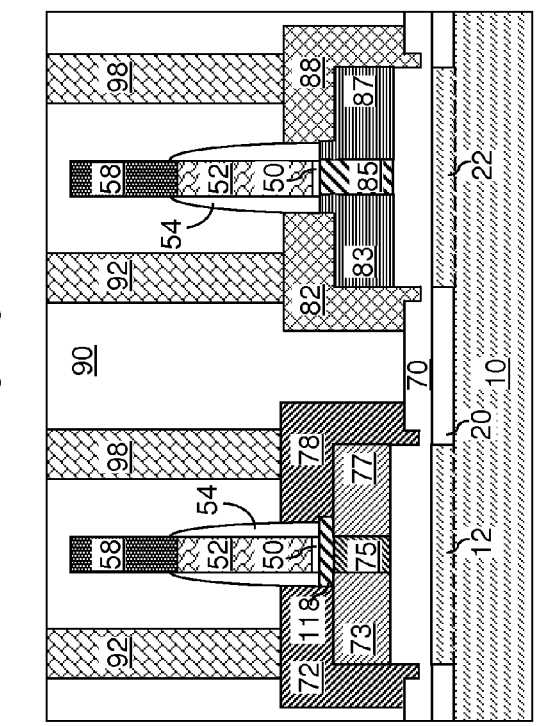

SILICON-GERMANIUM FINS AND SILICON FINS ON A BULK SUBSTRATE

BACKGROUND

The present disclosure relates to a semiconductor structure, and particularly to a semiconductor structure including silicon-germanium fins and silicon fins, and a method of manufacturing the same.

A semiconductor device formed on a semiconductor fin over a bulk semiconductor substrate is subject to leakage currents. Thus, an insulating material structure is desired between the semiconductor fin and the bulk semiconductor substrate. In order to optimize performance of semiconductor fin devices, semiconductor fins including different semiconductor materials may be needed on the same bulk semiconductor substrate. For example, a silicon-germanium alloy provides advantageous electrical properties for forming p-type field effect transistors, while being disadvantageous for forming n-type field effect transistors. Thus, a method is desired for forming semiconductor fins including different semiconductor materials on a bulk substrate in conjunction with insulating material structures.

BRIEF SUMMARY

A first silicon-germanium alloy layer is formed on a semiconductor substrate including silicon. A stack of a first silicon layer and a second silicon-germanium alloy layer is formed over a first region of the first silicon-germanium alloy layer, and a second silicon layer thicker than the first silicon layer is formed over a second region of the first silicon-germanium alloy layer. The first silicon-germanium alloy layer has a greater germanium concentration than the second silicon-germanium alloy layer. At least one first semiconductor fin is formed in the first region, and at least one second semiconductor fin is formed in the second region. After formation of a shallow trench isolation structure, gate electrodes, and gate spacers that cover sidewalls of the first and second semiconductor fins, the shallow trench isolation structure is recessed and material portions from the first silicon-germanium alloy layer are removed. Remaining portions of the first silicon layer are removed to provide at least one silicon-germanium alloy fin in the first region, while at least one silicon fin is provided in the second region. Fin field effect transistors can be formed on the at least one silicon-germanium alloy fin and the at least one silicon fin.

According to an aspect of the present disclosure, a method of forming a semiconductor structure is provided. A stack is formed on a semiconductor substrate. The stack includes, from bottom to top, a first silicon-germanium alloy layer, a silicon layer overlying a portion of the first silicon-germanium alloy layer, and a second silicon-germanium alloy layer. The stack and an upper portion of the semiconductor substrate are patterned to form a fin stack structure having a pair of substantially vertical sidewalls. The fin stack structure includes, from bottom to top, a protruding semiconductor portion derived from the upper portion of the semiconductor substrate, a silicon-germanium alloy portion, a silicon portion, and a silicon-germanium alloy fin. A shallow trench isolation structure is formed, which includes a dielectric material and laterally surrounds the protruding semiconductor portion and a lower portion of the silicon-germanium alloy portion. A dielectric spacer that contacts all sidewall surfaces of the silicon-germanium alloy fin is formed. A cavity is formed underneath the silicon portion by removing the silicon-germanium alloy portion selective to the silicon portion while the dielectric spacer prevents etching of the silicon-germanium alloy fin.

According to another aspect of the present disclosure, a semiconductor structure is provided, which contains a semiconductor substrate including a planar top surface and a protruding semiconductor portion that protrudes above the planar top surface. A shallow trench isolation structure is in contact with the planar top surface and laterally surrounds the protruding semiconductor portion. A dielectric material layer contacts the protruding semiconductor material portion, overlies portions of the shallow trench isolation structure, and includes a rectangular cuboid portion overlying the protruding semiconductor portion. A silicon-germanium alloy fin overlies the rectangular cuboid portion. The silicon-germanium alloy fin, the rectangular cuboid, and the protruding semiconductor portion have sidewalls within a pair of substantially vertical parallel planes.

BRIEF DESCRIPTION OF SEVERAL VIEWS OF THE DRAWINGS

FIG. 2A is a top-down view of the first exemplary semiconductor structure after formation of a stack of a first silicon layer and a second silicon-germanium alloy layer and formation of a second silicon layer according to the first embodiment of the present disclosure.

FIG. 2B is a vertical cross-sectional view of the first exemplary semiconductor structure along the vertical plane B-B' of FIG. 2A.

FIG. 3A is a top-down view of the first exemplary semiconductor structure after formation of fin cap structures according to the first embodiment of the present disclosure.

FIG. 3B is a vertical cross-sectional view of the selected region of the first exemplary semiconductor structure along the vertical plane B-B' of FIG. 3A.

FIG. 3C is a vertical cross-sectional view of the selected region of the first exemplary semiconductor structure along the vertical plane C-C' of FIG. 3A.

FIG. 3D is a vertical cross-sectional view of the selected region of the first exemplary semiconductor structure along the vertical plane D-D' of FIG. 3A.

FIG. 4A is a top-down view of the first exemplary semiconductor structure after the formation of first fin structures and second fin structures according to the first embodiment of the present disclosure.

FIG. 4B is a vertical cross-sectional view of the first exemplary semiconductor structure along the vertical plane B-B' of FIG. 4A.

FIG. 4C is a vertical cross-sectional view of the first exemplary semiconductor structure along the vertical plane C-C' of FIG. 4A.

FIG. 4D is a vertical cross-sectional view of the first exemplary semiconductor structure along the vertical plane D-D' of FIG. 4A.

FIG. 5A is a top-down view of the first exemplary semiconductor structure after formation of a shallow trench isolation structure according to the first embodiment of the present disclosure.

FIG. 5B is a vertical cross-sectional view of the first exemplary semiconductor structure along the vertical plane B-B' of FIG. 5A.

FIG. 5C is a vertical cross-sectional view of the first exemplary semiconductor structure along the vertical plane C-C' of FIG. 5A.

FIG. 5D is a vertical cross-sectional view of the first exemplary semiconductor structure along the vertical plane D-D' of FIG. 5A.

FIG. 6A is a top-down view of the first exemplary semiconductor structure after formation of gate stack structures according to the first embodiment of the present disclosure.

FIG. 6B is a vertical cross-sectional view of the first exemplary semiconductor structure along the vertical plane B-B' of FIG. 6A.

FIG. 6C is a vertical cross-sectional view of the first exemplary semiconductor structure along the vertical plane C-C' of FIG. 6A.

FIG. 6D is a vertical cross-sectional view of the first exemplary semiconductor structure along the vertical plane D-D' of FIG. 6A.

FIG. 7A is a top-down view of the first exemplary semiconductor structure after formation of dielectric spacers according to the first embodiment of the present disclosure.

FIG. 7B is a vertical cross-sectional view of the first exemplary semiconductor structure along the vertical plane B-B' of FIG. 7A.

FIG. 7C is a vertical cross-sectional view of the first exemplary semiconductor structure along the vertical plane C-C' of FIG. 7A.

FIG. 7D is a vertical cross-sectional view of the first exemplary semiconductor structure along the vertical plane D-D' of FIG. 7A.

FIG. 8A is a top-down view of the first exemplary semiconductor structure after recessing of the shallow trench isolation structure according to the first embodiment of the present disclosure.

FIG. 8B is a vertical cross-sectional view of the first exemplary semiconductor structure along the vertical plane B-B' of FIG. 8A.

FIG. 8C is a vertical cross-sectional view of the first exemplary semiconductor structure along the vertical plane C-C' of FIG. 8A.

FIG. 8D is a vertical cross-sectional view of the first exemplary semiconductor structure along the vertical plane D-D' of FIG. 8A.

FIG. 9A is a top-down view of the first exemplary semiconductor structure after removal of remaining portions of the first silicon-germanium alloy layer according to the first embodiment of the present disclosure.

FIG. 9B is a vertical cross-sectional view of the first exemplary semiconductor structure along the vertical plane B-B' of FIG. 9A.

FIG. 9C is a vertical cross-sectional view of the first exemplary semiconductor structure along the vertical plane C-C' of FIG. 9A.

FIG. 9D is a vertical cross-sectional view of the first exemplary semiconductor structure along the vertical plane D-D' of FIG. 9A.

FIG. 10A is a top-down view of the first exemplary semiconductor structure after removing remaining portions of the first silicon layer and bottom portions of silicon fins according to the first embodiment of the present disclosure.

FIG. 10B is a vertical cross-sectional view of the first exemplary semiconductor structure along the vertical plane B-B' of FIG. 10A.

FIG. 10C is a vertical cross-sectional view of the first exemplary semiconductor structure along the vertical plane C-C' of FIG. 10A.

FIG. 10D is a vertical cross-sectional view of the first exemplary semiconductor structure along the vertical plane D-D' of FIG. 10A.

FIG. 11A is a top-down view of the first exemplary semiconductor structure after deposition of a dielectric material layer according to the first embodiment of the present disclosure.

FIG. 11B is a vertical cross-sectional view of the first exemplary semiconductor structure along the vertical plane B-B' of FIG. 11A.

FIG. 11C is a vertical cross-sectional view of the first exemplary semiconductor structure along the vertical plane C-C' of FIG. 11A.

FIG. 11D is a vertical cross-sectional view of the first exemplary semiconductor structure along the vertical plane D-D' of FIG. 11A.

FIG. 12A is a top-down view of the first exemplary semiconductor structure after an anisotropic etch of the dielectric spacers to form gate spacers according to the first embodiment of the present disclosure.

FIG. 12B is a vertical cross-sectional view of the first exemplary semiconductor structure along the vertical plane B-B' of FIG. 12A.

FIG. 12C is a vertical cross-sectional view of the first exemplary semiconductor structure along the vertical plane C-C' of FIG. 12A.

FIG. 12D is a vertical cross-sectional view of the first exemplary semiconductor structure along the vertical plane D-D' of FIG. 12A.

FIG. 13A is a top-down view of the first exemplary semiconductor structure after formation of raised source regions and raised drain regions according to the first embodiment of the present disclosure.

FIG. 13B is a vertical cross-sectional view of the first exemplary semiconductor structure along the vertical plane B-B' of FIG. 13A.

FIG. 13C is a vertical cross-sectional view of the first exemplary semiconductor structure along the vertical plane C-C' of FIG. 13A.

FIG. 13D is a vertical cross-sectional view of the first exemplary semiconductor structure along the vertical plane D-D' of FIG. 13A.

FIG. 14A is a top-down view of the first exemplary semiconductor structure after formation of a contact-level dielectric layer and contact via structures according to the first embodiment of the present disclosure.

FIG. 14B is a vertical cross-sectional view of the first exemplary semiconductor structure along the vertical plane B-B' of FIG. 14A.

FIG. 14C is a vertical cross-sectional view of the first exemplary semiconductor structure along the vertical plane C-C' of FIG. 14A.

FIG. 14D is a vertical cross-sectional view of the first exemplary semiconductor structure along the vertical plane D-D' of FIG. 14A.

FIG. 15A is a top-down view of a second exemplary semiconductor structure after formation of first fin structures and second fin structures according to a second embodiment of the present disclosure.

FIG. 15B is a vertical cross-sectional view of the second exemplary semiconductor structure along the vertical plane B-B' of FIG. 15A.

FIG. 15C is a vertical cross-sectional view of the second exemplary semiconductor structure along the vertical plane C-C' of FIG. 15A.

FIG. 15D is a vertical cross-sectional view of the second exemplary semiconductor structure along the vertical plane D-D' of FIG. 15A.

FIG. 16A is a top-down view of a second exemplary semiconductor structure after formation of a contact-level dielectric layer and contact via structures according to the first embodiment of the present disclosure.

FIG. 16B is a vertical cross-sectional view of the second exemplary semiconductor structure along the vertical plane B-B' of FIG. 16A.

FIG. 16C is a vertical cross-sectional view of the second exemplary semiconductor structure along the vertical plane C-C' of FIG. 16A.

FIG. 16D is a vertical cross-sectional view of the second exemplary semiconductor structure along the vertical plane D-D' of FIG. 16A.

DETAILED DESCRIPTION

Figure 1A:
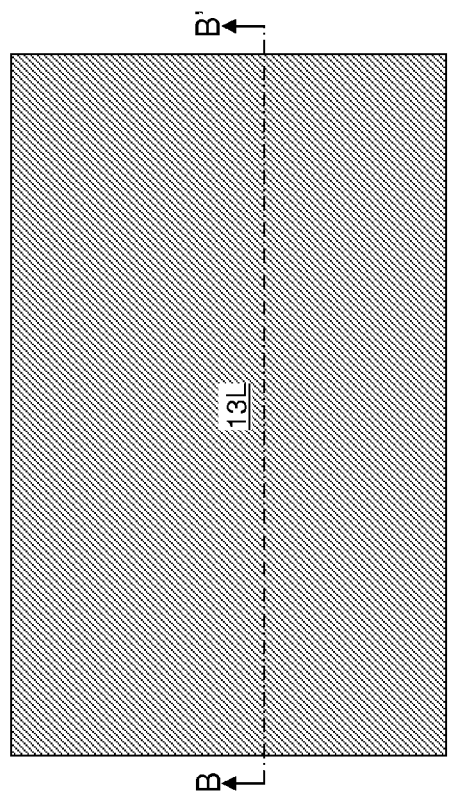
FIG. 1A is a top-down view of a first exemplary semiconductor structure after formation of a first silicon-germanium alloy layer on a semiconductor substrate including silicon according to a first embodiment of the present disclosure.

As stated above, the present disclosure relates to a semiconductor structure including silicon-germanium fins and silicon fins, and a method of manufacturing the same. Aspects of the present disclosure are now described in detail with accompanying figures. It is noted that like reference numerals refer to like elements across different embodiments. The drawings are not necessarily drawn to scale. Ordinals are used merely to distinguish among similar elements, and different ordinals may be employed across the specification and the claims of the instant application.

Figure 1B:
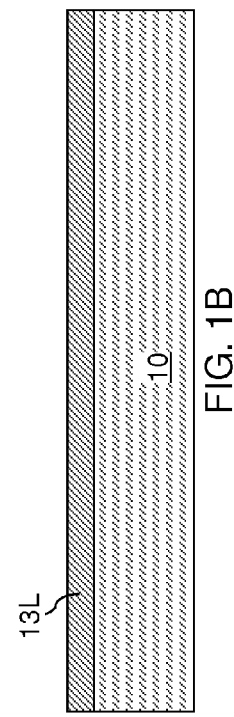
FIG. 1B is a vertical cross-sectional view of the first exemplary semiconductor structure along the vertical plane B-B' of FIG. 1A.
Figure 7E:
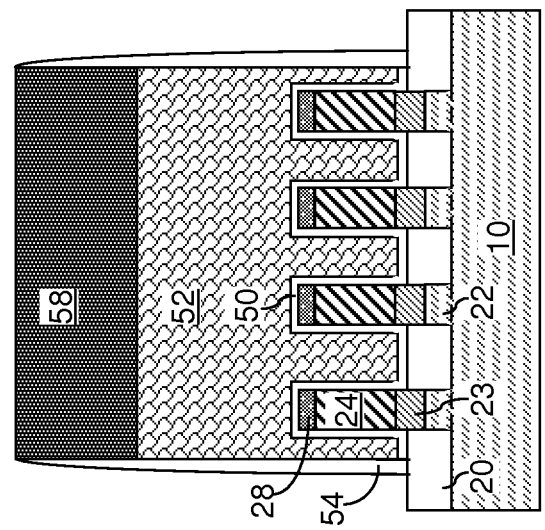
FIG. 7E is a vertical cross-sectional view of the first exemplary semiconductor structure along the vertical plane E-E' of FIG. 7A.
Figure 7F:
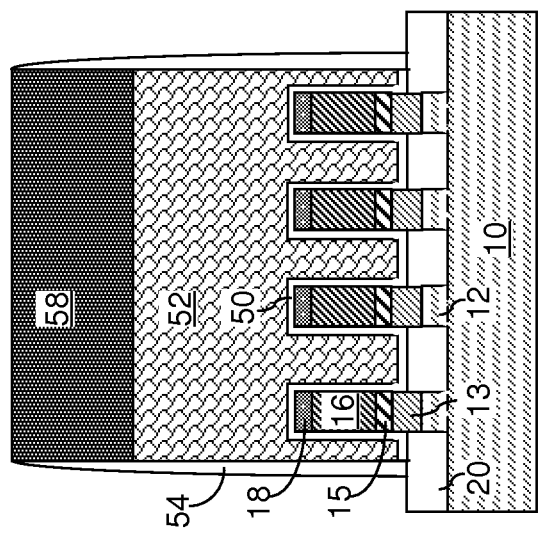
FIG. 7F is a vertical cross-sectional view of the first exemplary semiconductor structure along the vertical plane F-F' of FIG. 7A.
Figure 8F:
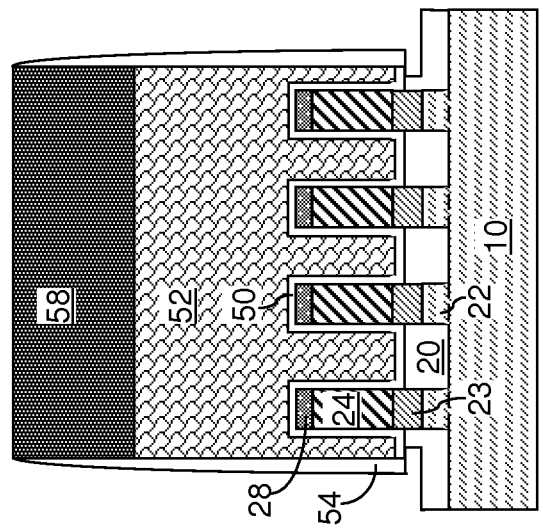
FIG. 8F is a vertical cross-sectional view of the first exemplary semiconductor structure along the vertical plane F-F' of FIG. 8A.
Figure 8E:
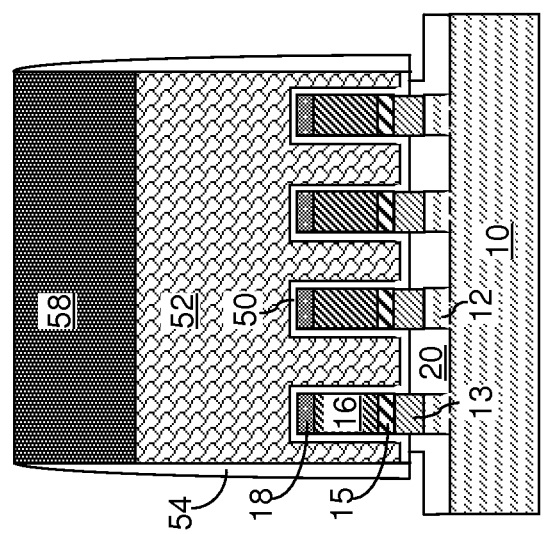
FIG. 8E is a vertical cross-sectional view of the first exemplary semiconductor structure along the vertical plane E-E' of FIG. 8A.
Figure 9F:
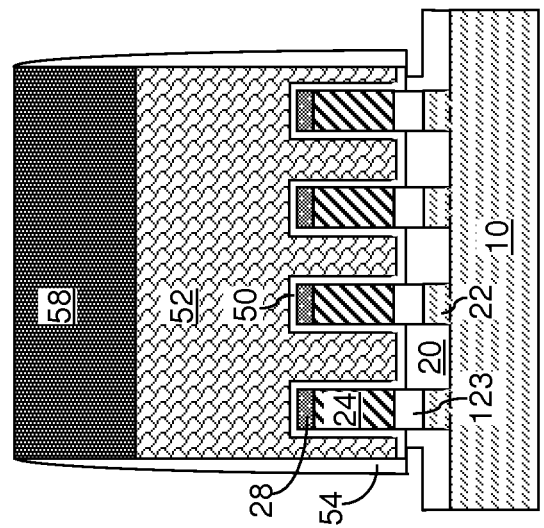
FIG. 9F is a vertical cross-sectional view of the first exemplary semiconductor structure along the vertical plane F-F' of FIG. 9A.
Figure 9E:
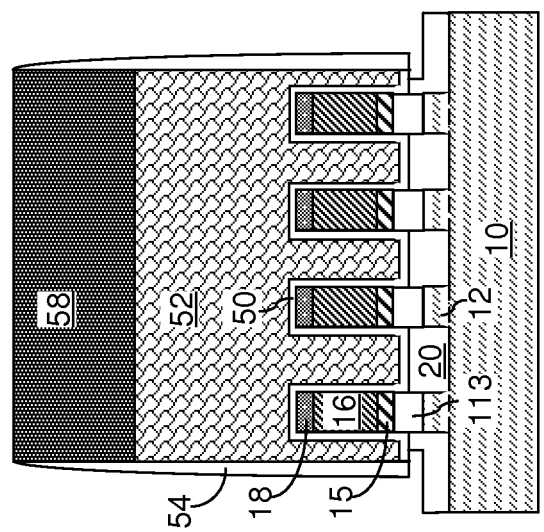
FIG. 9E is a vertical cross-sectional view of the first exemplary semiconductor structure along the vertical plane E-E' of FIG. 9A.
Figure 10E:
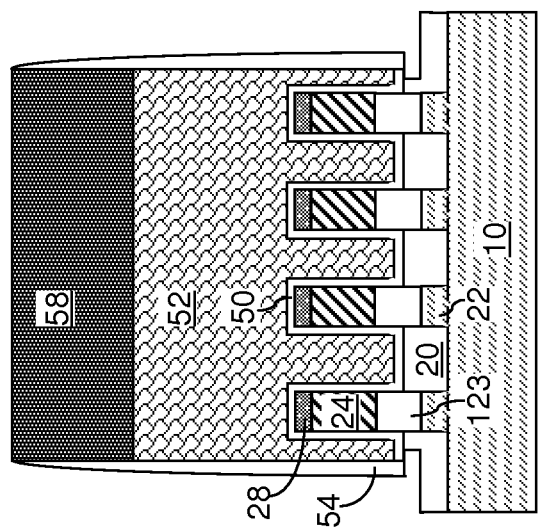
FIG. 10E is a vertical cross-sectional view of the first exemplary semiconductor structure along the vertical plane E-E' of FIG. 10A.
Figure 10F:
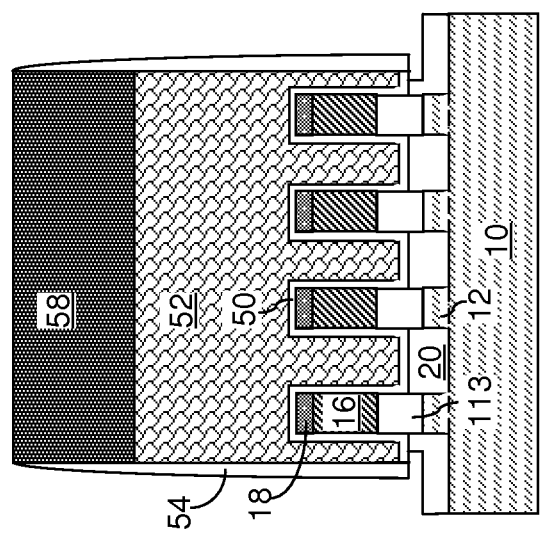
FIG. 10F is a vertical cross-sectional view of the first exemplary semiconductor structure along the vertical plane F-F' of FIG. 10A.
Figure 11F:
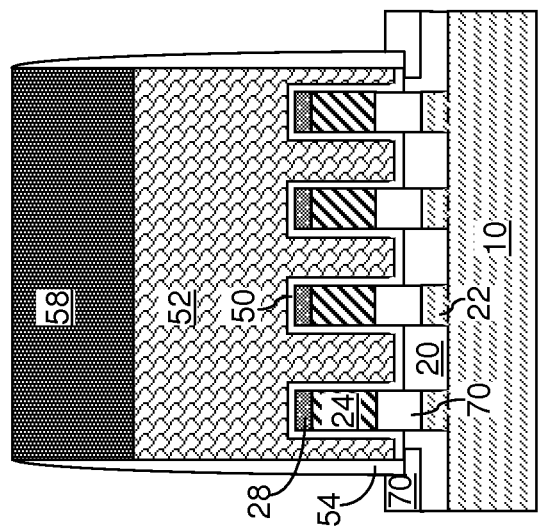
FIG. 11F is a vertical cross-sectional view of the first exemplary semiconductor structure along the vertical plane F-F' of FIG. 11A.
Figure 11E:
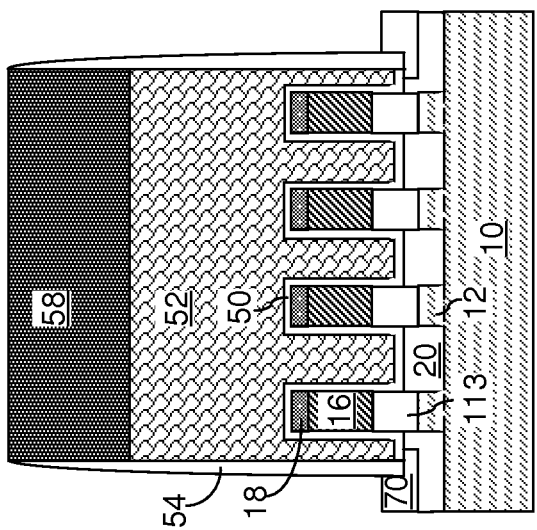
FIG. 11E is a vertical cross-sectional view of the first exemplary semiconductor structure along the vertical plane E-E' of FIG. 11A.
Figure 12E:
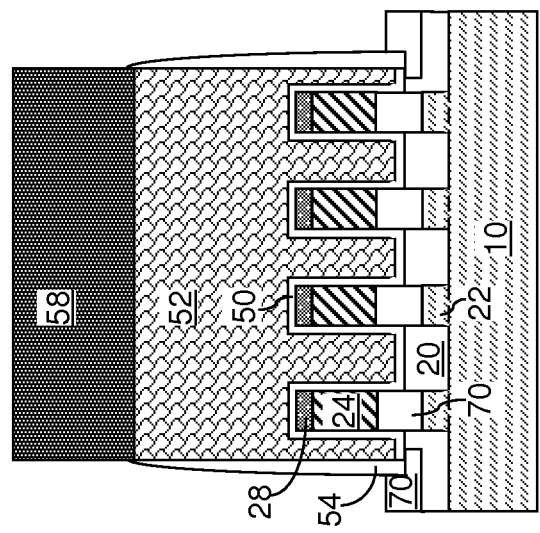
FIG. 12E is a vertical cross-sectional view of the first exemplary semiconductor structure along the vertical plane E-E' of FIG. 12A.
Figure 12F:
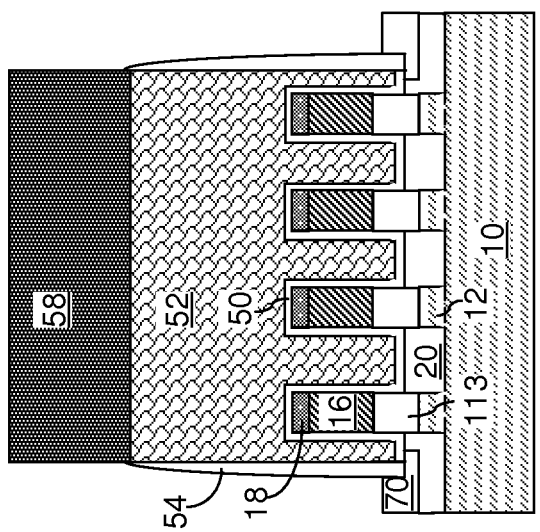
FIG. 12F is a vertical cross-sectional view of the first exemplary semiconductor structure along the vertical plane F-F' of FIG. 12A.

Referring to FIGS. 1A and 1B, a first exemplary semiconductor structure according to a first embodiment of the present disclosure includes a semiconductor substrate 10 and a first silicon-germanium alloy layer 13L formed on the top surface of the semiconductor substrate 10. The semiconductor substrate 10 includes silicon. The first silicon-germanium alloy layer 13L includes germanium atoms at an atomic concentration in a range from 20% to 80%, although lesser and greater atomic concentrations of germanium can also be employed. The semiconductor substrate 10 can be free of germanium, or can include germanium at an atomic concentration that is less than 20% of the atomic concentration of germanium in the first silicon-germanium alloy layer 13L. Thus, germanium is either absent in the semiconductor substrate 10, or is present at an atomic concentration not greater than 16% in the semiconductor substrate 10. In one embodiment, the semiconductor substrate 10 can be single crystalline throughout the entirety thereof.

In one embodiment, the semiconductor substrate 10 can include a doped silicon layer or an undoped silicon layer. The doped silicon layer or the undoped silicon layer is free of germanium. If the semiconductor substrate 10 includes a doped silicon layer, the doped silicon layer can consist essentially of silicon and p-type dopants and/or n-type dopants. If the semiconductor substrate 10 includes an undoped silicon layer, the undoped silicon layer can consist essentially of silicon. The entirety of the doped or undoped silicon layer can be single crystalline.

The first silicon-germanium alloy layer 13L can be formed, for example, by epitaxy of a silicon-germanium alloy material. In one embodiment, the entirety of the first silicon-germanium alloy layer 13L can be single crystalline, and is epitaxially aligned to the single crystalline silicon-containing material in the semiconductor substrate 10. The thickness of the first silicon-germanium alloy layer 13L can be in a range from 10 nm to 40 nm, although lesser and greater thicknesses can also be employed.

Referring to FIGS. 2A and 2B, a semiconductor layer stack (15L, 16L) including a first silicon layer 15L and a second silicon-germanium alloy layer 16L is formed in a first region R1 over the first silicon-germanium alloy layer 13L, and a second silicon layer 24L is formed in a second region R2 over the first silicon-germanium alloy layer 13L.

The semiconductor layer stack (15L, 16L) and the second silicon layer 24L can be formed sequentially. The semiconductor layer stack (15L, 16L) may be formed prior to, or after, formation of the second silicon layer 24L. In order to form the semiconductor layer stack (15L, 16L), the top surface of the first silicon-germanium alloy layer 13L in the second region R2 may be masked with a dielectric masking material layer (such as a silicon oxide layer or a silicon nitride layer) to prevent deposition of the semiconductor material in the second device region R2, while deposition of semiconductor materials occurs in the first region R1. Selective epitaxy can be employed to deposit the semiconductor materials of the semiconductor layer stack (15L, 16L) in the first region R1, while the semiconductor materials of the semiconductor layer stack (15L, 16L) do not grow on dielectric surfaces. The dielectric masking layer is subsequently removed.

During formation of the second silicon layer 24L, the top surface of the first silicon-germanium alloy layer 13L in the first region R1 may be masked with a dielectric masking material layer (such as a silicon oxide layer or a silicon nitride layer), while deposition of silicon occurs in the second region R2. Selective epitaxy can be employed to silicon in the second region R2, while the silicon does not grow on dielectric surfaces. The dielectric masking layer is subsequently removed.

Alternatively, one of the semiconductor layer stack (15L, 16L) and the second silicon layer 24L can be formed on the entire top surface of the first silicon-germanium alloy layer 13L, and removed, partially or fully, from one of the first region R1 and the second region to form a recessed region. The top surface of the first silicon-germanium alloy layer 13L may, or may not, be physically exposed in the recessed region. Subsequently, a dielectric masking layer and a selective epitaxy process may be employed to form the other of the semiconductor layer stack (15L, 16L) and the second silicon layer 24L in the recessed region. The dielectric masking layer may be subsequently removed, for example, by a wet etch.

The first silicon layer 15L can include doped silicon or undoped silicon. In one embodiment, the first silicon layer 15L can be an intrinsic silicon layer. The first silicon layer 15L can have a thickness in a range from 2.5 nm to 10 nm, although lesser and greater thicknesses can also be employed. In one embodiment, the entirety of the first silicon layer 15L is single crystalline, and is epitaxially aligned to the single crystalline structure of the first silicon-germanium alloy layer 13L.

The second silicon-germanium alloy layer 16L includes germanium atoms at an atomic concentration in a range from 3% to 40%, although lesser and greater atomic concentrations of germanium can also be employed. The atomic concentration of germanium in the second silicon-germanium alloy layer 16L is less than the atomic concentration of germanium in the first silicon-germanium alloy layer 12L by at least 10%. In one embodiment, the atomic concentration of germanium in the second silicon-germanium alloy layer 16L can be less than 75% the atomic concentration of germanium in the first silicon-germanium alloy layer 12L. In another embodiment, the atomic concentration of germanium in the second silicon-germanium alloy layer 16L can be less than ½ of the atomic concentration of germanium in the first silicon-germanium alloy layer 12L. In one embodiment, the entirety of the second silicon-germanium alloy layer 16L is single crystalline, and is epitaxially aligned to the single crystalline structure of the first silicon layer 15L. The thickness of the second silicon-germanium alloy layer 16L can be in a range from 15 nm to 60 nm, although lesser and greater thicknesses can also be employed. The second silicon-germanium alloy layer 16L can be intrinsic, or can be doped with electrical dopants, which can be p-type dopants or n-type dopants.

The second silicon layer 24L is thicker than the first silicon layer 15L. In one embodiment, the second silicon layer 24L can be thicker than the first silicon layer 15L by at least 10 nm. The second silicon layer 24L can include doped silicon or undoped silicon. In one embodiment, the second silicon layer 24L can be an intrinsic silicon layer. The second silicon layer 24L can have a thickness in a range from 17.5 nm to 70 nm, although lesser and greater thicknesses can also be employed. In one embodiment, the entirety of the second silicon layer 24L is single crystalline, and is epitaxially aligned to the single crystalline structure of the first silicon-germanium alloy layer 13L.

In the first region R1, a first stack is formed, which includes, from bottom to top, a first portion of the first silicon-germanium alloy layer 13L, the first silicon layer 15L overlying the first portion of the first silicon-germanium alloy layer 13L, and the second silicon-germanium alloy layer 16L overlying the first silicon layer 15L. In the second region R2, a second stack is formed, which includes, from bottom to top, a second portion of the first silicon-germanium alloy layer 13L and a second silicon layer 24L that overlies the second portion of the first silicon-germanium alloy layer 13L and having a greater thickness than the first silicon layer 13L.

Referring to FIGS. 3A-3D, a fin cap dielectric layer including a dielectric material is formed over the first silicon layer 15L and the second silicon layer 24L. The dielectric material of the fin cap dielectric layer can be silicon oxide, silicon nitride, or silicon oxynitride. In one embodiment, the fin cap dielectric layer can be a silicon nitride layer. The thickness of the fin cap dielectric layer can be from 3 nm to 60 nm, although lesser and greater thicknesses can also be employed.

A photoresist layer 37 is applied over the fin cap dielectric layer and is lithographically patterned to provide fin-shaped photoresist portions. As used herein, a "fin" refers to a structure having a pair of substantially vertical sidewalls that extend along the lengthwise direction of the structure. As used herein, a surface is "substantially vertical" if the deviation of the surface from a vertical plane is less than twice the surface roughness of the surface or the angle of a plane that fits the surface by a minimum root mean square deviation relative to a vertical direction is less than 3 degrees. As used herein, a "lengthwise direction" refers to the horizontal direction along which a structure extends the most. In one embodiment, the photoresist portions can have rectangular horizontal cross-sectional shapes.

The pattern in the patterned photoresist layer 37 is subsequently transferred through the fin cap dielectric layer, for example, by an anisotropic etch such as a reactive ion etch. First fin cap structures 18 are formed from remaining portions of the fin cap dielectric layer in the first region R1. Second fin cap structures 28 are formed from remaining portions of the fin cap dielectric layer in the second region R2. The photoresist layer 37 can be subsequently removed, for example, by ashing.

Referring to FIGS. 4A-4D, the pattern in the first and second fin cap structures (18, 28) is transferred through the underlying semiconductor material layers (16L, 15L, 13L, 24L) and into an upper portion of the semiconductor substrate 10 by an anisotropic etch. Specifically, the pattern in the first fin cap structures 18 is transferred through the first stack of the second silicon-germanium alloy layer 16L, the first silicon layer 15L, and the first portion of the first silicon-germanium alloy layer 13L, and into the portion of the semiconductor substrate 8 in the first region R1. The pattern in the second fin cap structures 28 is transferred through the second stack of the second silicon layer 24L and the second portion of the first silicon-germanium alloy layer 13L in the second region R2.

Each remaining portion of the second silicon-germanium alloy layer 16L is a silicon-germanium alloy fin 16. Each remaining portion of the first silicon layer 15L is a silicon portion 15. Each remaining portion of the first silicon-germanium alloy layer 13L in the first region R1 is a first silicon-germanium alloy portion 13 (i.e., a first silicon-germanium alloy portion formed in the first region R1). Each patterned portion of semiconductor substrate 8 in the first region R1 is a first protruding semiconductor portion 12. The first protruding semiconductor portions 12 are derived from an upper portion of the semiconductor substrate 10, has the same material as the semiconductor substrate 10, and can be epitaxially aligned to the semiconductor substrate 10. In one embodiment, the semiconductor substrate 10 and the first protruding semiconductor portions 12 can be single crystalline silicon having epitaxial alignment throughout the entirety thereof.

Each remaining portion of the second silicon layer 24L is a silicon fin 24. Each remaining portion of the first silicon-germanium alloy layer 13L in the second region R2 is a second silicon-germanium alloy portion 23 (i.e., a first silicon-germanium alloy portion formed in the second region R2). Each patterned portion of semiconductor substrate 8 in the second region R2 is a second protruding semiconductor portion 22. The second protruding semiconductor portions 22 are derived from the upper portion of the semiconductor substrate 10, has the same material as the semiconductor substrate 10, and can be epitaxially aligned to the semiconductor substrate 10. In one embodiment, the semiconductor substrate 10, the first protruding semiconductor portions 12, and the second protruding semiconductor portions 22 can be single crystalline silicon having epitaxial alignment throughout the entirety thereof.

Each stack of a first fin cap structure 18, a silicon-germanium alloy fin 16, a silicon portion 15, a first-region first silicon-germanium alloy portion 13, and a first protruding semiconductor portion 12 is herein referred to as a first fin stack structure (12, 13, 15, 16, 18). Each first fin stack structure (12, 13, 15, 16, 18) can have a substantially same horizontal cross-sectional shape throughout the entirety thereof. As used herein, horizontal cross-sectional shapes of a structure are substantially the same if the deviation of each horizontal cross-sectional shape is less than twice the surface roughness of the average shape for the horizontal cross-sectional shapes. Each first fin stack structure (12, 13, 15, 16, 18) has a pair of substantially vertical sidewalls that extends along the lengthwise direction of the first fin stack structure (12, 13, 15, 16, 18) between the topmost surface of the first fin cap structure 18 therein and the bottommost surface of the first protruding semiconductor portion 12 therein. Thus, for each first fin stack structure (12, 13, 15, 16, 18), each component of the first fin stack structure (12, 13, 15, 16, 18) has sidewalls within a pair of substantially vertical parallel planes. In one embodiment, the first protruding semiconductor portions 12 include silicon, and do not include germanium. In one embodiment, the remaining portion of the semiconductor substrate 10 and the first protruding semiconductor portions 12 are single crystalline and are epitaxially aligned to one another.

Each stack of a second fin cap structure 28, a silicon fin 24, a second silicon-germanium alloy portion 23, and a second protruding semiconductor portion 12 is herein referred to as a second fin stack structure (22, 23, 24, 28). Each second fin stack structure (22, 23, 24, 28) can have a substantially same horizontal cross-sectional shape throughout the entirety thereof. Each second fin stack structure (22, 23, 24, 28) has a pair of substantially vertical sidewalls that extends along the lengthwise direction of the second fin stack structure (22, 23, 24, 28) between the topmost surface of the second fin cap structure 28 therein and the bottommost surface of the second protruding semiconductor portion 22 therein. Thus, for each second fin stack structure (22, 23, 24, 28), each component of the second fin stack structure (22, 23, 24, 28) has sidewalls within a pair of substantially vertical parallel planes. In one embodiment, the second protruding semiconductor portions 22 include silicon, and do not include germanium. In one embodiment, the remaining portion of the semiconductor substrate 10 and the second protruding semiconductor portions 22 are single crystalline and are epitaxially aligned to one another.

Referring to FIGS. 5A-5D, a dielectric material such as silicon oxide is deposited over the first fin stack structures (12, 13, 15, 16, 18), the second fin stack structure (22, 23, 24, 28), and the semiconductor substrate 10. The deposited dielectric material is subsequently planarized, for example, by chemical mechanical planarization to form a shallow trench isolation structure 30 that laterally surrounds each of the first fin stack structures (12, 13, 15, 16, 18) and the second fin stack structure (22, 23, 24, 28). In one embodiment, the top surfaces of the first and second fin cap structures (18, 28) can be employed as stopping surfaces for the planarization process.

The shallow trench isolation structure 30 is subsequently recessed by an etch below the top surfaces of the first silicon-germanium alloy portions 13 and the second silicon-germanium alloy portions 23, which are herein collectively called as silicon-germanium alloy portions (13, 23). Sidewall surfaces of the silicon-germanium alloy portions (13, 23) are physically exposed. In one embodiment, the recessed top surface of the shallow trench isolation structure 30 can be between the top surfaces of the silicon-germanium alloy portions (13, 23) and above the top surface of the semiconductor substrate 10 that underlies the first and second protruding semiconductor portions (12, 22). In one embodiment, the recessed top surface of the shallow trench isolation structure 30 can be directly adjoined to the sidewalls the top surfaces of the silicon-germanium alloy portions (13, 23), i.e., can be located between the top surfaces of the silicon-germanium alloy portions (13, 23) and the bottom surfaces of the silicon-germanium alloy portions (13, 23). In one embodiment, the shallow trench isolation structure 30 includes a dielectric material, and laterally surrounds each of the first and second protruding semiconductor portions (12, 22) and a lower portion of each first silicon-germanium alloy portion (13, 23).

Referring to FIGS. 6A-6D, gate stack structures are formed along widthwise direction of the first fin stack structures (12, 13, 15, 16, 18) in the first region R1, and along widthwise direction of the second fin stack structure (22, 23, 24, 28) in the second region R2. As used herein, a widthwise direction is a horizontal direction that is perpendicular to the lengthwise direction. Each gate stack structure includes a vertical stack, from bottom to top, of a gate dielectric 50, a gate electrode 52, and a gate cap dielectric 58. The gate stack structures (50, 52, 58) can be formed, for example, by formation of a gate material layer stack including a gate dielectric layer, a gate electrode layer including at least one conductive material, and a gate cap dielectric layer including a dielectric material, and by patterning the gate material layer stack by a combination of lithographic methods and at least one anisotropic etch. The dielectric material of the gate cap dielectric layer can be, for example, silicon nitride. A single gate stack structure (50, 52, 58) or a plurality of gate stack structures (50, 52, 58) may straddle each first fin stack structure (12, 13, 15, 16, 18) in the first region R1 or each second fin stack structure (22, 23, 24, 28) in the second region R2. In one embodiment, a gate stack may straddle one or more first fin stack structures (12, 13, 15, 16, 18) in the first region R1 or one or more second fin stack structures (22, 23, 24, 28).

Referring to FIGS. 7A-7F, a dielectric material layer is deposited over the first exemplary semiconductor structure by a conformal deposition method such as low pressure chemical vapor deposition (LPCVD). The dielectric material layer includes a dielectric material such silicon nitride. The thickness of the dielectric material layer can be, for example, in a range from 3 nm to 100 nm, although lesser and greater thicknesses can also be employed. An anisotropic etch is performed to remove horizontal portions of the dielectric material layer. A remaining contiguous vertical portion of the dielectric material layer constitutes a dielectric spacer 54 that laterally surrounds the gate electrode(s) (50, 52, 58) and the first fin stack structures (12, 13, 15, 16, 18) in the first region R1. Another remaining contiguous vertical portion of the dielectric material layer constitutes another dielectric spacer 54 that laterally surrounds the gate electrodes (50, 52, 58) and the second fin stack structures (22, 23, 24, 28) in the second region R2. Overetch of the dielectric material layer after removal of the horizontal portions of the dielectric material layer is minimized so that each dielectric spacer 54 contacts sidewalls of first fin stack structures (12, 13, 15, 16, 18) in the first region R1 or sidewalls of the second fin stack structures (22, 23, 24, 28) in the second region R2.

The dielectric spacer 54 in the first region R1 can contact, and laterally surround, each first fin cap structure 18 in the first region R1. The dielectric spacer 54 in the first region R1 can contact, and laterally surround, all sidewall surfaces of the silicon-germanium alloy fins 16 in the first region R1. The dielectric spacer 54 in the second region R2 can contact, and laterally surround, each second fin cap structure 28 in the second region R2. The dielectric spacer 54 in the second region R2 can contact, and laterally surround, all sidewall surfaces of the silicon fins 24 in the second region R2.

The dielectric spacers 54 in the first region R1 and in the second region R2 are formed concurrently employing the same processing steps, i.e., by deposition of the dielectric material layer and the anisotropic etch. All bottom portions of the dielectric spacers 54 can have the same width throughout, which is the same as the thickness of the dielectric material layer that is deposited conformally, i.e., with the same thickness throughout. The bottommost surfaces of the dielectric spacers 54 are located within a horizontal plane between the top surfaces of the silicon-germanium alloy portions (13, 23).

Referring to FIGS. 8A-8F, an isotropic etch is performed to isotropically etch the shallow trench isolation structure 20 selective to the dielectric spacers 54, i.e., without etching the dielectric spacers 54. In one embodiment, the shallow trench isolation structure 20 can include silicon oxide, the dielectric spacers 54 can include silicon nitride, and the isotropic etch can be, for example, a wet etch employing hydrofluoric acid. The top surface of the shallow trench isolation structure 20 is recessed by the isotropic etch. Further, the shallow trench isolation structure 20 is laterally etched so that sidewall surfaces of the first and second silicon-germanium alloy portions (13, 23) are physically exposed. The shallow trench isolation structure 20, as recessed by the isotropic etch, is in contact with the planar top surface of the semiconductor substrate 10, and laterally surrounds the first and second protruding semiconductor portions (12, 22).

Referring to FIGS. 9A-9F, the first and second silicon-germanium alloy portions (13, 23), which are remaining portions of the first silicon-germanium alloy layer 13L as formed at the processing steps of FIGS. 4A-4D, are removed employing an isotropic etch selective to the first and second protruding semiconductor portions (12, 22), the silicon portion 15, the silicon fin 24, and the dielectric spacers 54. The chemistry of the isotropic etch is selected such that the silicon germanium alloy in the first and second silicon-germanium alloy portions (13, 23) can be removed without etching any significant quantity of semiconductor materials with lesser atomic concentration of germanium. In other words, removal of the first and second silicon-germanium alloy portions (13, 23) is performed employing an isotropic etch that is selective to a semiconductor material of the first and second protruding semiconductor portions (12, 22).

In one embodiment, the isotropic etch can be a wet etch employing a combination of hydrogen peroxide and hydrofluoric acid. In this case, the silicon portion 15 and the silicon fin 24 are not etched in any significant quantity because the silicon portion 15 and the silicon fin 24 do not include any germanium. The first and second protruding semiconductor portions (12, 22) either do not include any germanium, or includes germanium at an atomic concentration that is less than 20% of the atomic concentration of germanium in the first and second silicon-germanium alloy portions (13, 23). Thus, selectivity of the isotropic etch of the material of the first and second silicon-germanium alloy portions (13, 23) relative to the first and second protruding semiconductor portions (12, 22) can be maintained above 10. If the first and second protruding semiconductor portions (12, 22) are doped or undoped silicon portions that do not include any germanium, the selectivity of an isotropic etch employing a combination of hydrogen peroxide and hydrofluoric acid can be at least 200.

In the first region R1, the first silicon-germanium alloy portion 13 is removed selective to the silicon portion 15 while the dielectric spacer 54 prevents etching of the silicon-germanium alloy fin 15. A first cavity 113 is formed underneath the silicon portion 15 after complete removal of the first silicon-germanium alloy portion 13. In the second region R2, the second silicon-germanium alloy portion 23 is removed selective to the silicon fin 24. A second cavity 113 is formed underneath the silicon fin 24 after complete removal of the second silicon-germanium alloy portion 23. The first cavity 113 and the second cavity 123 are concurrently formed.

Referring to FIGS. 10A-10F, another isotropic etch is performed to etch the semiconductor material, i.e., silicon, of the silicon portion 15 and the silicon fin 24. The isotropic etch can be, for example, a chemical dry etch employing hydrogen chloride as an etchant. The duration of the isotropic etch can be selected such that the isotropic etch terminates upon removal of all of the silicon portions 15. The etch of the silicon-germanium alloy fins 16 is minimized. The bottom surface of each silicon-germanium alloy fin 16 becomes physically exposed, and each first cavity 113 is vertically expanded. A bottom portion of each silicon fin 24 is concurrently etched with the etching of the silicon portions 15, and each second cavity 123 is vertically expanded.

Referring to FIGS. 11A-11F, a dielectric material is deposited by a conformal deposition method such as low pressure chemical vapor deposition (LPCVD). The dielectric material can be optionally planarized afterward, for example, employing the gate cap dielectrics 58 as a stopping layer. The dielectric material can be subsequently recessed, for example, by a recess etch, to form a dielectric material layer 70. The dielectric material can be, for example, silicon oxide or silicon oxynitride.

The dielectric material layer 70 can contact top surfaces of the shallow trench isolation structure 20 that are not in contact with a gate dielectric 50. The dielectric material layer 70 fills the first cavity 113 and the second cavity 123. Each portion of the dielectric material layer 70 that fills one of the first cavities 113 is herein referred to as a first rectangular cuboid portion 70A, i.e., a portion having a shape of a rectangular cuboid. As used herein, a "rectangular cuboid" refers to a three-dimensional structure consisting of six surfaces, in which each of the six surfaces are rectangular surfaces. The volume of each first rectangular cuboid portion 70A can be the same as the corresponding first expanded cavity 113. Each portion of the dielectric material layer 70 that fills one of the second cavities 123 is herein referred to as a second rectangular cuboid portion 70B, i.e., a portion having a shape of a rectangular cuboid. The volume of each second rectangular cuboid portion 70B can be the same as the volume of the corresponding second expanded cavity 123.

The dielectric material layer 70 contacts the first and second protruding semiconductor material portion (12, 22), and overlies portions of the shallow trench isolation structure 20. Each first rectangular cuboid portion 70A overlies a first protruding semiconductor portion 12. Each second rectangular cuboid portion 70B overlies a second protruding semiconductor portion 22. Each silicon-germanium alloy fin 16 overlies a first rectangular cuboid portion 70A. Each stack of a first fin cap structure 18, a silicon-germanium alloy fin 16, a first rectangular cuboid portion 70A, and a first protruding semiconductor portion 12 has sidewalls within a pair of substantially vertical parallel planes, and constitute a first fin structure. In one embodiment, within each first fin structure (18, 16, 70A, 12), each element can have a same rectangular horizontal cross-sectional shape. Each stack of a second fin cap structure 28, a silicon fin 24, a second rectangular cuboid portion 70B, and a second protruding semiconductor portion 22 has sidewalls within a pair of substantially vertical parallel planes, and constitute a second fin structure. In one embodiment, within each second fin structure (28, 24, 70B, 22), each element can have a same rectangular horizontal cross-sectional shape.

Each gate dielectric 50 can contact a horizontal surface of the shallow trench isolation structure 20, a sidewall of a rectangular cuboid portion (70A or 70B), a sidewall of a silicon-germanium alloy fin 16, and a horizontal surface of the dielectric material layer 70 located underneath the gate stack (50, 52, 58).

Referring to FIGS. 12A-12F, an anisotropic etch can be performed to etch the dielectric material of the dielectric spacers 54. The dielectric spacers 54 are vertically recessed so that sidewalls surfaces of the silicon-germanium alloy fins 16 and sidewalls of the silicon fins 24 become physically exposed. In one embodiment, the portions of the dielectric spacers 54 that are laterally spaced from the sidewalls of the gate stack structures (50, 52, 58) can be completely removed, and the remaining portions of the dielectric spacers 54 can constitute gate spacers that laterally surround each gate stack structure (50, 52, 58).

In one embodiment, top surfaces of the dielectric material layer 70 in proximity to the first fin structures (18, 16, 70A, 12) or the second fin structures (28, 24, 70B, 22) can include grooves 77. The grooves 77 are located in regions from which dielectric spacers 54 are completely removed during the anisotropic etch. Thus, the width of the grooves 77 can be the same as the width of the bottommost portions of the dielectric spacer 54. Each groove 77 adjoins sidewalls of the first rectangular cuboid portions 70A (See FIG. 11B) or adjoins sidewalls of the second rectangular cuboid portions 70B (See FIG. 11B). Each dielectric spacer 54, as recessed after the anisotropic etch, laterally surrounds a gate stack structure (50, 52, 58), and the grooves 77 have the same width as a bottom portion of the dielectric spacers 54.

In one embodiment, physically exposed portions of the first fin cap structures 18 and the second fin cap structures 28 can be removed during the anisotropic etch, and top surfaces of the silicon-germanium alloy fins 16 and the silicon fins 24 can be physically exposed. In this case, each remaining portion of the first fin cap structures 18 and the second fin cap structures 28, which are dielectric material portions, can underlie a gate stack structure (50, 52, 58) and a dielectric spacer 54, and can overlie a silicon-germanium alloy fin 16 or a silicon fin 24.

Referring to FIGS. 13A-13D, raised source regions (71, 82) and raised drain regions (78, 88) can be optionally formed, for example, by selective epitaxy. Specifically, a first raised source region 72 and a first raised drain region 78 can be formed by depositing a first additional semiconductor material on physically exposed surfaces of the silicon-germanium alloy fins 16. A second raised source region 82 and a second raised drain region 88 can be formed by depositing a second additional semiconductor material (which can be the same as, or different from, the first additional semiconductor material) on physically exposed surfaces of the silicon fins 24. Each of the first additional semiconductor material and the second additional semiconductor material can be deposited, for example, by selective epitaxy, in which the first and/or second additional semiconductor materials grow on semiconductor surfaces and do not grow on dielectric surfaces. Each of the first additional semiconductor material and the second additional semiconductor material can independently be, for example, silicon, a silicon-germanium alloy, or a silicon-carbon alloy.

The first raised source region 72 and the first raised drain region 78 can be doped with p-type dopants or n-type dopants either during, or after, deposition of the first additional semiconductor material. In one embodiment, the dopants introduced into the first raised source region 72 and the first raised drain region 78 can be p-type dopants such as boron, gallium, and/or indium. The first raised source region 72 and the first raised drain region 78 can be doped by in-situ doping, or can be doped by ion implantation. The first raised source region 72 and the raised drain region 78 can extend across a plurality of first fin structures (18, 16, 70A, 12) along a direction parallel to the lengthwise direction of the first fin structures (18, 16, 70A, 12).

The second raised source region 82 and the second raised drain region 88 can be doped with p-type dopants or n-type dopants either during, or after, deposition of the second additional semiconductor material. In one embodiment, the dopants introduced into the second raised source region 82 and the second raised drain region 88 can be n-type dopants such as phosphorous, arsenic, and/or antimony. The second raised source region 82 and the second raised drain region 88 can be doped by in-situ doping, or can be doped by ion implantation. The second raised source region 82 and the raised drain region 88 can extend across a plurality of second fin structures (28, 24, 70B, 22) along a direction parallel to the lengthwise direction of the second fin structures (28, 24, 70B, 22).

The first raised source region 72 is located on one side of the gate stack structure (50, 52, 58) in the first region R1, includes a doped semiconductor material, and contacts first sidewalls of the silicon-germanium alloy fins 16 and first sidewalls of the first rectangular cuboid portions 70A (See FIG. 11B). The first raised drain region 78 is located on the other side of the gate stack structure (50, 52, 58) in the first region R1, includes a doped semiconductor material, and contacts second sidewalls of the silicon-germanium alloy fins 16 and second sidewalls of the first rectangular cuboid portions 70A (See FIG. 11B).

The second raised source region 82 is located on one side of the gate stack structure (50, 52, 58) in the second region R2, includes another doped semiconductor material, and contacts first sidewalls of the silicon-germanium alloy fins 16 and first sidewalls of the second rectangular cuboid portions 70B (See FIG. 11B). The second raised drain region 88 is located on the other side of the gate stack structure (50, 52, 58) in the second region R2, includes the same doped semiconductor material as the second raised source region 82, and contacts second sidewalls of the silicon-germanium alloy fins 16 and second sidewalls of the second rectangular cuboid portions 70A (See FIG. 11B).

Dopants in the first raised source region 72 and the first raised drain region 78 may be diffused into underlying portions of the silicon-germanium alloy fins 16 to form first source regions 73 and first drain regions 77. Alternatively or additionally, dopants may be implanted into portions of the silicon-germanium alloy fins 16, employing the gate stack structures (50, 52, 58) and dielectric spacers 54 in the first region R1 as implantation masks, to form first source regions 73 and first drain regions 77. Portions of the silicon-germanium alloy fins 16 that are not doped with additional dopants by diffusion or ion implantation constitute first body regions 75 including channels for a first field effect transistor formed in the first region R1.

Dopants in the second raised source region 82 and the second raised drain region 88 may be diffused into underlying portions of the silicon fins 24 to form second source regions 83 and second drain regions 87. Alternatively or additionally, dopants may be implanted into portions of the silicon fins 24, employing the gate stack structures (50, 52, 58) and dielectric spacers 54 in the second region R2 as implantation masks, to form second source regions 83 and second drain regions 87. Portions of the silicon fins 24 that are not doped with additional dopants by diffusion or ion implantation constitute second body regions 85 including channels for a second field effect transistor formed in the second region R2.

Referring to FIGS. 14A-14D, a contact-level dielectric layer 80 can be subsequently deposited over the first exemplary semiconductor structure. The contact-level dielectric layer 90 includes a dielectric material such as porous or non-porous organosilicate glass (OSG), silicon oxide, silicon nitride, or a combination thereof. The top surface of the contact-level dielectric layer 90 can be planarized, for example, by chemical mechanical planarization. Various contact via structures are formed through the contact-level dielectric layer 90 employing methods known in the art. The various contact via structures can include, for example, source contact via structures 92, gate contact via structures 95, and drain side contact via structures 98.

Referring to FIGS. 15A-15D, a second exemplary semiconductor structure according to a second embodiment of the present disclosure can be derived from the first exemplary semiconductor structure by substituting a silicon layer for the fin cap dielectric layer employed at the processing steps of FIGS. 3A-3D. The silicon layer can consist of undoped silicon or doped silicon, and can have a thickness in a range from 2.5 nm to 10 nm, although lesser and greater thicknesses can also be employed. In one embodiment, the silicon layer can have the same composition as the second silicon-germanium alloy layer 24L. In one embodiment, the silicon layer can be formed concurrently with formation of the topmost portion of the second silicon-germanium alloy layer 24L.

A photoresist layer 37 (See FIGS. 3A-3D) is applied and patterned in the same manner as in the first embodiment. The pattern in the photoresist layer 37 is subsequently transferred through the underlying semiconductor material layers and into an upper portion of the semiconductor substrate 10 by an anisotropic etch in the same manner as in the first embodiment. Each remaining portion of the silicon layer that substitutes the in cap dielectric layer constitutes a silicon fin cap portion 118. Each remaining portion of the second silicon-germanium alloy layer 16L is a silicon-germanium alloy fin 16. Each remaining portion of the first silicon layer 15L is a silicon portion 15. Each remaining portion of the first silicon-germanium alloy layer 13L in the first region R1 is a first silicon-germanium alloy portion 13 (i.e., a first silicon-germanium alloy portion formed in the first region R1). Each patterned portion of semiconductor substrate 8 in the first region R1 is a first protruding semiconductor portion 12. The first protruding semiconductor portions 12 are derived from an upper portion of the semiconductor substrate 10, has the same material as the semiconductor substrate 10, and can be epitaxially aligned to the semiconductor substrate 10. In one embodiment, the semiconductor substrate 10 and the first protruding semiconductor portions 12 can be single crystalline silicon having epitaxial alignment throughout the entirety thereof.

Each remaining portion of the second silicon layer 24L is a silicon fin 24. Each remaining portion of the first silicon-germanium alloy layer 13L in the second region R2 is a second silicon-germanium alloy portion 23 (i.e., a first silicon-germanium alloy portion formed in the second region R2). Each patterned portion of semiconductor substrate 8 in the second region R2 is a second protruding semiconductor portion 22. The second protruding semiconductor portions 22 are derived from the upper portion of the semiconductor substrate 10, has the same material as the semiconductor substrate 10, and can be epitaxially aligned to the semiconductor substrate 10. In one embodiment, the semiconductor substrate 10, the first protruding semiconductor portions 12, and the second protruding semiconductor portions 22 can be single crystalline silicon having epitaxial alignment throughout the entirety thereof.

Each stack of a silicon fin cap structure 118, a silicon-germanium alloy fin 16, a silicon portion 15, a first-region first silicon-germanium alloy portion 13, and a first protruding semiconductor portion 12 is herein referred to as a first fin stack structure (12, 13, 15, 16, 118). Each first fin stack structure (12, 13, 15, 16, 118) can have a substantially same horizontal cross-sectional shape throughout the entirety thereof. Each first fin stack structure (12, 13, 15, 16, 118) has a pair of substantially vertical sidewalls that extends along the lengthwise direction of the first fin stack structure (12, 13, 15, 16, 118) between the topmost surface of the silicon fin cap structure 118 therein and the bottommost surface of the first protruding semiconductor portion 12 therein. Thus, for each first fin stack structure (12, 13, 15, 16, 118), each component of the first fin stack structure (12, 13, 15, 16, 118) has sidewalls within a pair of substantially vertical parallel planes. In one embodiment, the first protruding semiconductor portions 12 include silicon, and do not include germanium. In one embodiment, the remaining portion of the semiconductor substrate 10 and the first protruding semiconductor portions 12 are single crystalline and are epitaxially aligned to one another.

Each stack of a silicon fin 24, a second silicon-germanium alloy portion 23, and a second protruding semiconductor portion 12 is herein referred to as a second fin stack structure (22, 23, 24). Each second fin stack structure (22, 23, 24) can have a substantially same horizontal cross-sectional shape throughout the entirety thereof. Each second fin stack structure (22, 23, 24) has a pair of substantially vertical sidewalls that extends along the lengthwise direction of the second fin stack structure (22, 23, 24) between the topmost surface of the silicon fin 24 therein and the bottommost surface of the second protruding semiconductor portion 22 therein. Thus, for each second fin stack structure (22, 23, 24), each component of the second fin stack structure (22, 23, 24) has sidewalls within a pair of substantially vertical parallel planes. In one embodiment, the second protruding semiconductor portions 22 include silicon, and do not include germanium. In one embodiment, the remaining portion of the semiconductor substrate 10 and the second protruding semiconductor portions 22 are single crystalline and are epitaxially aligned to one another.

Referring to FIGS. 16A-16D, the processing steps of FIGS. 5A-5D, 6A-6D, 7A-7F, 8A-8F, 9A-9F, 10A-10F, 11A-11F, 12A-12F, 13A-13D, and 14A-14D can be subsequently performed.

At the processing steps corresponding to the processing steps of FIGS. 10A-10F, physically exposed portions of the silicon fin cap structures 118 and an upper portion of the silicon fins 24 can be removed during the isotropic etch that removes the silicon portions 15 and bottom portions of the silicon fins 24. In this case, the silicon fins 24 can include a raised portion that contacts a bottom surface of an overlying gate dielectric 50 and recessed top surfaces located within a horizontal plane lower than the interface between the topmost surfaces of the silicon fins 24 and the gate dielectric 50 in the second region R2. Correspondingly, each of the second body regions 85, the second source regions 83, and the second drain regions 87 can include portions protruding above recessed top surfaces of the second source regions 82 and the second drain regions 87.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
    forming a stack including, from bottom to top, a first silicon-germanium alloy layer, a silicon layer overlying a portion of said first silicon-germanium alloy layer, and a second silicon-germanium alloy layer on a semiconductor substrate;
    patterning said stack and an upper portion of said semiconductor substrate to foam a fin stack structure having a pair of substantially vertical sidewalls, said fin stack structure including, from bottom to top, a protruding semiconductor portion derived from said upper portion of said semiconductor substrate, a silicon-germanium alloy portion, a silicon portion, and a silicon-germanium alloy fin;
    forming a shallow trench isolation structure comprising a dielectric material and laterally surrounding said protruding semiconductor portion and a lower portion of said silicon-germanium alloy portion;
    forming a dielectric spacer that contacts all sidewall surfaces of said silicon-germanium alloy fin; and
    forming a cavity underneath said silicon portion by removing said silicon-germanium alloy portion selective to said silicon portion while said dielectric spacer prevents etching of said silicon-germanium alloy fin; and
    physically exposing a bottom surface of said silicon-germanium alloy fin by removing said silicon portion, wherein said cavity is vertically expanded.

2. The method of claim 1, further comprising depositing a dielectric material layer after said cavity is vertically expanded, wherein a rectangular cuboid portion of said dielectric material layer fills said vertically expanded cavity.

3. The method of claim 1, further comprising forming a gate stack structure including a gate dielectric and a gate electrode over a portion of said fin stack structure prior to forming said dielectric spacer.

4. The method of claim 3, wherein said dielectric spacer laterally surrounds said fin stack structure and said gate stack structure upon formation of said dielectric spacer.

5. The method of claim 3, further comprising recessing a top surface of said shallow trench isolation structure and laterally etching said shallow trench isolation structure after formation of said dielectric spacer, wherein sidewall surfaces of said silicon-germanium alloy portion are physically exposed.

6. The method of claim 5, wherein said removing of said silicon-germanium alloy portion is performed employing an isotropic etch that is selective to a semiconductor material of said protruding semiconductor portion.

7. The method of claim 6, wherein said protruding semiconductor portion comprises silicon and does not comprise germanium.

8. The method of claim 3, further comprising anisotropically etching said dielectric spacer to physically expose sidewalls of said silicon-germanium alloy fin, while a remaining portion of said dielectric spacer forms a gate spacer that laterally surrounds said gate stack structure.

9. The method of claim 1, further comprising
    forming another stack including, from bottom to top, said first silicon-germanium alloy layer and another silicon layer overlying another portion of said first silicon-germanium alloy layer and having a greater thickness than said silicon layer on said semiconductor substrate;
    patterning said another stack and said upper portion of said semiconductor substrate to form another fin stack structure having another pair of substantially vertical sidewalls, said another fin stack structure including, from bottom to top, another protruding semiconductor portion derived from said upper portion of said semiconductor substrate, another silicon-germanium alloy portion, and a silicon fin;
    forming another dielectric spacer that contacts all sidewall surfaces of said silicon fin concurrently with said forming of said dielectric spacer; and
    forming another cavity underneath said silicon fin by removing said another silicon-germanium alloy portion selective to said silicon fin concurrently with said forming of said cavity.

10. The method of claim 9, further comprising:
    physically exposing a bottom surface of said silicon-germanium alloy fin by removing said silicon portion, wherein said cavity is vertically expanded; and
    removing a bottom portion of said silicon fin concurrently with said removing of said silicon portion, wherein said another cavity is vertically expanded.

11. The method of claim 10, further comprising depositing a dielectric material layer after said cavity and said another cavity are vertically expanded, wherein a rectangular cuboid portion of said dielectric material layer fills said vertically expanded cavity, and another rectangular cuboid portion of said dielectric material layer fills said vertically expanded another cavity.

12. A semiconductor structure comprising:
    a semiconductor substrate including a planar top surface and a protruding semiconductor portion that protrudes above said planar top surface;
    a shallow trench isolation structure in contact with said planar top surface and laterally surrounding said protruding semiconductor portion;
    a dielectric material layer contacting said protruding semiconductor material portion and overlying portions of said shallow trench isolation structure and including a rectangular cuboid portion overlying said protruding semiconductor portion;
    a silicon-germanium alloy fin overlying said rectangular cuboid portion, wherein said silicon-germanium alloy fin, said rectangular cuboid, and said protruding semiconductor portion have sidewalls within a pair of substantially vertical parallel planes; and
    a gate stack structure straddling said silicon-germanium alloy fin, said rectangular cuboid portion, and said protruding semiconductor portion, wherein a surface of said dielectric material layer includes grooves adjoining sidewalls of said rectangular cuboid portion.

13. The semiconductor structure of claim 12, wherein said protruding semiconductor portion, said rectangular cuboid portion, and said silicon-germanium alloy fin have a same horizontal cross-sectional shape.

14. The semiconductor structure of claim 12, further comprising:
a raised source region located on one side of said gate stack structure and comprising a doped semiconductor material and contacting first sidewalls of said silicon-germanium alloy fin and first sidewalls of said rectangular cuboid portion; and
a raised drain region located on another side of said gate stack structure and comprising said doped semiconductor material and contacting second sidewalls of said silicon-germanium alloy fin and second sidewalls of said rectangular cuboid portion.

15. The semiconductor structure of claim 12, further comprising a dielectric spacer laterally surrounding said gate stack structure, wherein said grooves have a same width as a bottom portion of said dielectric spacer.

16. The semiconductor structure of claim 15, further comprising a dielectric material portion underlying said gate stack structure and said dielectric spacer and overlying said silicon-germanium alloy fin.

17. The semiconductor structure of claim 12, wherein said gate stack structure comprises a gate dielectric that contacts a horizontal surface of said shallow trench isolation structure, a sidewall of said rectangular cuboid portion, a sidewall of said silicon-germanium alloy fin, and a horizontal surface of said dielectric material layer.

18. The semiconductor structure of claim 12, wherein said semiconductor substrate further includes another protruding semiconductor portion that protrudes above said planar top surface, and said shallow trench isolation structure laterally surrounds said another protruding semiconductor portion, and said dielectric material layer contacts said another protruding semiconductor material portion and includes another rectangular cuboid portion overlying said another protruding semiconductor portion.

19. The semiconductor structure of claim 18, further comprising a silicon fin overlying said another rectangular cuboid portion.

20. The semiconductor structure of claim 19, wherein said silicon fin, said another rectangular cuboid, and said another protruding semiconductor portion have sidewalls within another pair of substantially vertical parallel planes.

21. The semiconductor structure of claim 19, wherein said silicon-germanium alloy fin includes a first source region, a first drain region, and a first body region, and said silicon fin includes a second source region, a second drain region, and a second body region, and said semiconductor structure further comprises:
a first gate stack structure including a first gate dielectric and a first gate electrode and straddling said first body region; and
a second gate stack structure including a second gate dielectric and a second gate electrode and straddling said second body region.

22. The semiconductor structure of claim 12, wherein said semiconductor substrate and said protruding semiconductor portion are single crystalline and epitaxially aligned to each other.

* * * * *